United States Patent
Soriaga et al.

(10) Patent No.: US 10,348,329 B2
(45) Date of Patent: Jul. 9, 2019

(54) LOW DENSITY PARITY CHECK (LDPC) CIRCULAR BUFFER RATE MATCHING

(71) Applicant: QUALCOMM Incorporated, San Diego, CA (US)

(72) Inventors: Joseph Binamira Soriaga, San Diego, CA (US); Shrinivas Kudekar, Raritan, NJ (US); Thomas Joseph Richardson, South Orange, NJ (US); Jing Jiang, San Diego, CA (US); Renqiu Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/894,197

(22) Filed: Feb. 12, 2018

(65) Prior Publication Data

US 2018/0234114 A1 Aug. 16, 2018

Related U.S. Application Data

(60) Provisional application No. 62/458,495, filed on Feb. 13, 2017.

(51) Int. Cl.
*H04L 1/00* (2006.01)
*H03M 13/11* (2006.01)
(Continued)

(52) U.S. Cl.
CPC ...... *H03M 13/1148* (2013.01); *H03M 13/116* (2013.01); *H03M 13/1185* (2013.01);
(Continued)

(58) Field of Classification Search
CPC ............................ H04L 1/0067; H04L 1/0041
See application file for complete search history.

(56) References Cited

U.S. PATENT DOCUMENTS

| | | |
|---|---|---|
| 6,633,865 B1 | 10/2003 | Liao |
| 6,961,888 B2 | 11/2005 | Jin et al. |

(Continued)

FOREIGN PATENT DOCUMENTS

| | | |
|---|---|---|
| WO | WO-2017131813 A1 | 8/2017 |
| WO | WO-2017171396 A1 | 10/2017 |

OTHER PUBLICATIONS

Ericsson: "Rate Matching for LDPC Codes", 3GPP Draft; R1-1611322 Rate Matching for LDPC Codes, 3rd Generation Partnership Project (3GPP), Mobile Competence Centre; 650, Route Des Lucioles; F-06921 Sophia-Antipolis Cedex; France, vol. RAN WG1, No. Reno, USA; Nov. 14, 2016-Nov. 18, 2016, Nov. 6, 2016 (Nov. 6, 2016), 6 Pages, XP051190690, Retrieved from the Internet: URL: http://www.3gpp.org/ftp/tsg_ran/WG1_RL 1/TSGR1_87/Docs/ [retrieved on Nov. 6, 2016].

(Continued)

*Primary Examiner* — Joseph D Torres
(74) *Attorney, Agent, or Firm* — Linda G. Gunderson; Loza & Loza

(57) ABSTRACT

Aspects of the present disclosure relate to low density parity check (LDPC) coding utilizing a configurable circular buffer for rate matched transmissions. The circular buffer may be configured based on a selected mother code rate and a fixed circular buffer length. For example, the respective sizes of the systematic and parity bit sections of the circular buffer may be variable based on the selected mother code rate.

30 Claims, 12 Drawing Sheets

(51) Int. Cl.
  *H03M 13/00* (2006.01)
  *H04L 1/18* (2006.01)
  *H03M 13/09* (2006.01)

(52) U.S. Cl.
  CPC ... *H03M 13/1188* (2013.01); *H03M 13/6306* (2013.01); *H03M 13/6356* (2013.01); *H03M 13/6393* (2013.01); *H03M 13/6516* (2013.01); *H04L 1/0041* (2013.01); *H04L 1/0058* (2013.01); *H04L 1/1819* (2013.01); *H03M 13/09* (2013.01)

(56) References Cited

U.S. PATENT DOCUMENTS

| | | | |
|---|---|---|---|
| 7,133,853 B2 | 11/2006 | Richardson et al. | |
| 7,552,097 B2 | 6/2009 | Richardson et al. | |
| 7,627,801 B2 | 12/2009 | Jin et al. | |
| 8,751,902 B2 | 6/2014 | Jin et al. | |
| 9,844,036 B2* | 12/2017 | Seo | H04W 4/70 |
| 2007/0109956 A1* | 5/2007 | Kwon | H04L 1/0003 370/208 |
| 2008/0301536 A1* | 12/2008 | Shin | H04L 1/0043 714/786 |
| 2008/0320353 A1* | 12/2008 | Blankenship | H04L 1/0068 714/746 |
| 2009/0003486 A1* | 1/2009 | Kwon | H04L 5/0007 375/299 |
| 2009/0028129 A1* | 1/2009 | Pi | H04L 1/0013 370/351 |
| 2009/0041110 A1* | 2/2009 | Malladi | H03M 13/2957 375/240 |
| 2009/0049359 A1* | 2/2009 | Malladi | H04L 1/0013 714/752 |
| 2009/0086849 A1* | 4/2009 | Tsai | H04L 1/1819 375/298 |
| 2009/0147724 A1* | 6/2009 | Nimbalker | H04L 1/0069 370/315 |
| 2010/0195662 A1* | 8/2010 | Kang | H04L 1/0043 370/412 |
| 2011/0239075 A1* | 9/2011 | Xu | H03M 13/116 714/751 |
| 2017/0093529 A1 | 3/2017 | Robert et al. | |
| 2017/0230149 A1 | 8/2017 | Wang et al. | |
| 2018/0007683 A1 | 1/2018 | You et al. | |

OTHER PUBLICATIONS

International Search Report and Written Opinion—PCT/US2018/018034—ISA/EPO—dated May 16, 2018.

Mackay D.J.C., "Good Error-Correcting Codes Based on Very Sparse Matrices," IEEE Transactions on Information Theory, Mar. 1999, vol. 45 (2), pp. 399-431.

Nokia, et al., "LDPC design for eMBB data", 3GPP Draft; R1-1701028 LDPC Design for EMBB, 3rd Generation Partnership Project (3GPP), Mobile Competence Centre; 650, Route Des Lucioles; F-06921 Sophia-Antipolis Cedex; France, vol. Ran WG1, No. Spokane, U.S.A., Jan. 16, 2017-Jan. 20, 2017, Jan. 16, 2017 (Jan. 16, 2017), 13 Pages, XP051208543, Retrieved from the Internet: URL: http://www.3gpp.org/ftp/Meetings_3GPP_SYNC/RAN1/Docs/ [retrieved on Jan. 16, 2017] the whole document.

Qualcomm Incorporated: "LDPC Rate Compatible Design", 3GPP Draft; R1-1700830_LDPC_RATE_COMPATIBLE_DESIGN, 3rd Generation Partnership Project (3GPP), Mobile Competence Centre; 650, Route Des Lucioles; F-06921 Sophia-Antipolis Cedex; France, vol. RAN WG1, No. Spokane, USA; Jan. 16, 2017-Jan. 20, 2017, Jan. 16, 2017 (Jan. 16, 2017), 19 Pages, XP051208349, Retrieved from the Internet: URL: http://www.3gpp.org/ftp/Meetings_3GPP_SYNC/RAN1/Docs/ [retrieved on Jan. 16, 2017].

Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.

Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.

3GPP TSG RAN WG1 AH_NR Meeting, Meeting Draft: R1-1701384; Spokane, USA, Meeting Date: Jan. 16-20, 2017; Agenda item: 5.1.5; Source: Session Chairman (Nokia); Title: Chairman's Notes of Agenda Item 5.1.5 Channel coding; Document Publication Date: Jan. 22, 2017 (Jan. 22, 2017); six Pages; Retrieved from the Internet: https://www.3gpp.org/ftp/tsg_ran/WG1_RL1/TSGR1_AH/NR_AH_1701/Docs/.

* cited by examiner $$H = \begin{bmatrix} c_1 & c_2 & c_3 & c_4 & c_5 & c_6 & c_7 & c_8 & c_9 & c_{10} & c_{11} & c_{12} \\ 0 & 0 & 1 & 0 & 0 & 1 & 1 & 1 & 0 & 0 & 0 & 0 \\ 1 & 1 & 1 & 0 & 0 & 0 & 0 & 0 & 0 & 1 & 1 & 0 \\ 0 & 1 & 0 & 0 & 1 & 0 & 0 & 1 & 1 & 1 & 0 & 0 \\ 0 & 0 & 0 & 1 & 0 & 0 & 1 & 0 & 1 & 0 & 0 & 1 \\ 1 & 0 & 1 & 0 & 0 & 1 & 0 & 0 & 1 & 0 & 0 & 0 \\ 0 & 0 & 0 & 0 & 1 & 1 & 0 & 1 & 0 & 0 & 1 & 0 \\ 1 & 0 & 0 & 1 & 1 & 0 & 0 & 0 & 0 & 0 & 1 & 1 \\ 0 & 1 & 0 & 1 & 0 & 0 & 0 & 1 & 0 & 1 & 0 & 0 \end{bmatrix}$$

FIG. 3

LOW DENSITY PARITY CHECK (LDPC) CIRCULAR BUFFER RATE MATCHING

PRIORITY CLAIM

This application claims priority to and the benefit of Provisional Patent Application No. 62/458,495 filed in the U.S. Patent and Trademark Office on Feb. 13, 2017, the entire content of which is incorporated herein by reference as if fully set forth below in its entirety and for all applicable purposes.

TECHNICAL FIELD

The technology discussed below relates generally to wireless communication systems, and more particularly, to low density parity check coding.

INTRODUCTION

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to the noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

For future networks, such as fifth generation (5G) New Radio networks, LDPC codes may continue to be implemented to support a wide range of information block lengths and a wide range of code rates. In order to achieve a high throughput with efficient hardware utilization, additional enhancements of LDPC codes are desired.

BRIEF SUMMARY OF SOME EXAMPLES

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure relate to mechanisms for low density parity check (LDPC) coding utilizing a configurable circular buffer for rate matched transmissions. A maximum circular buffer length may be defined based on the minimum mother code rate achievable at the maximum information block size for an LDPC code. If the information block size is less than the maximum information block size, the circular buffer length and/or respective sizes of systematic bit and parity bit sections of the circular buffer may be variable to support lower mother code rates, with some constraints, for example, on the absolute minimum mother code rate at which coding gains diminish. In some examples, a circular buffer may be defined with a fixed length and variable sized systematic bit and parity bit sections based on a selected mother code rate for the circular buffer. The selected mother code rate may be selected from two or more mother code rates, each associated with a particular information block length and LDPC base graph utilized for LDPC coding.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 3 illustrates an example of a low-density parity check (LDPC) matrix according to some aspects of the present disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
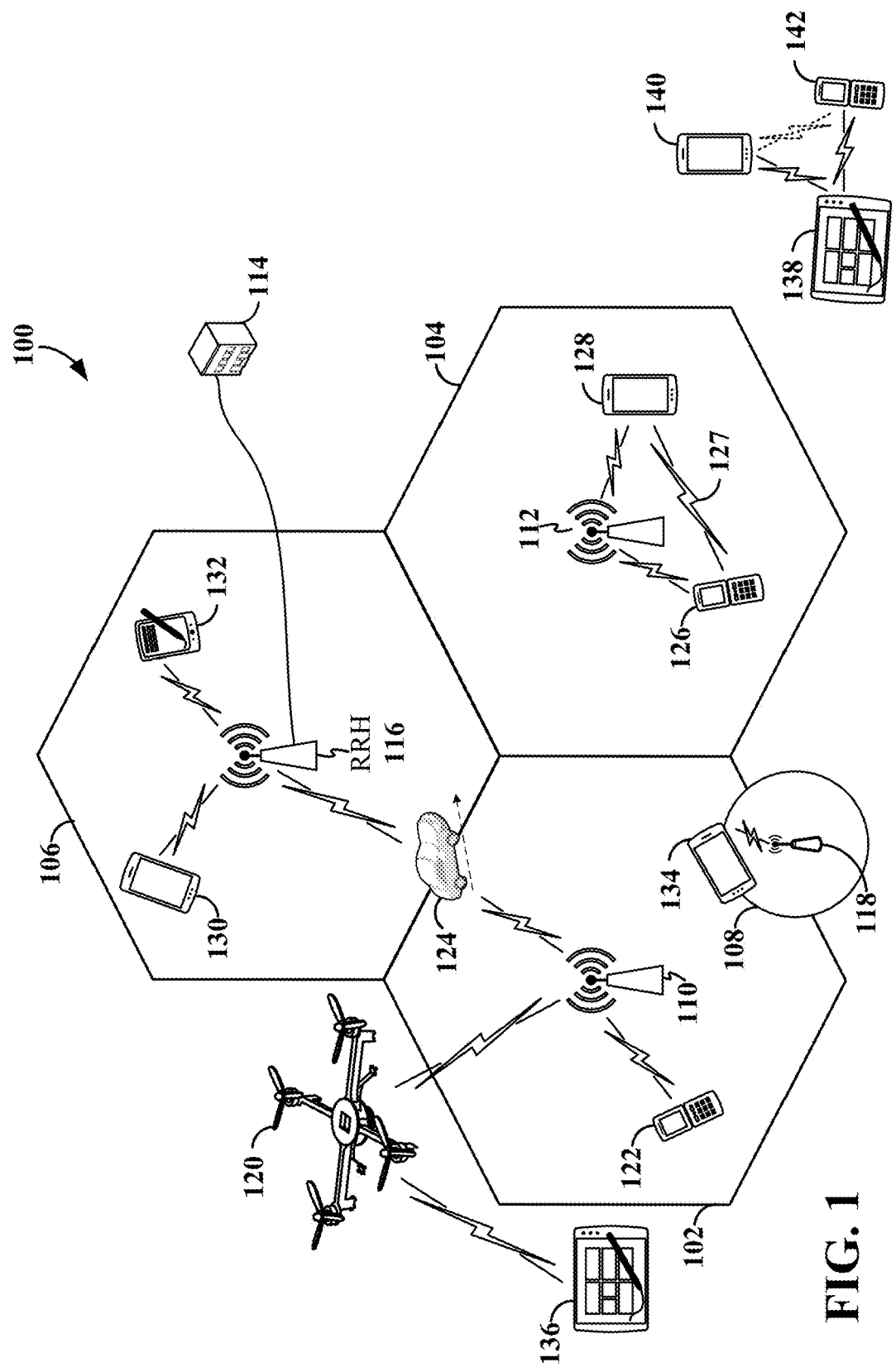
FIG. 1 is a diagram illustrating an example of a radio access network according to some aspects of the present disclosure.

The various concepts presented throughout this disclosure may be implemented across a broad variety of telecommunication systems, network architectures, and communication standards. Referring now to FIG. 1, as an illustrative example without limitation, a schematic illustration of a radio access network 100 is provided. In some examples, the radio access network 100 may be a network employing continued evolved wireless communication technologies. This may include, for example, a fifth generation (5G) or New Radio (NR) wireless communication technology based on a set of standards (e.g., issued by 3GPP, www.3gpp.org). For example, standards defined by the 3GPP following LTE-Advanced or by the 3GPP2 following CDMA2000 may be considered 5G. Standards may also include pre-3GPP efforts specified by Verizon Technical Forum and Korea Telecom SIG.

In other examples, the radio access network 100 may be a network employing a third generation (3G) wireless communication technology or a fourth generation (4G) wireless communication technology. For example, standards promulgated by the 3rd Generation Partnership Project (3GPP) and the 3rd Generation Partnership Project 2 (3GPP2) may be considered 3G or 4G, including but not limited to, Long-Term Evolution (LTE), LTE-Advanced, Evolved Packet System (EPS), and Universal Mobile Telecommunication System (UMTS). Additional examples of various radio access technologies based on one or more of the above-listed 3GPP standards include, but are not limited to, Universal Terrestrial Radio Access (UTRA), Evolved Universal Terrestrial Radio Access (eUTRA), General Packet Radio Service (GPRS) and Enhanced Data Rates for GSM Evolution (EDGE). Examples of such legacy standards defined by the 3rd Generation Partnership Project 2 (3GPP2) include, but are not limited to, CDMA2000 and Ultra Mobile Broadband (UMB). Other examples of standards employing 3G/4G wireless communication technology include the IEEE 802.16 (WiMAX) standard and other suitable standards.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes and constitution.

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB) or some other suitable terminology.

In FIG. 1, two base stations 110 and 112 are shown in cells 102 and 104; and a third base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the base station 118 supports a cell having a relatively small size. Cell sizing can be done according to system design as well as component constraints. It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion (not shown) of the network. The backhaul may provide a link between a base station and a core network (not shown), and in some examples, the backhaul may provide interconnection between the respective base stations. The core network may be a part of a wireless communication system and may be independent of the radio access technology used in the radio access network. Various types of backhaul interfaces may be employed, such as a direct physical connection, a virtual network, or the like using any suitable transport network.

The radio access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quadcopter, a remote control device, a consumer and/or wearable device, such as eyewear, a wearable camera, a virtual reality device, a smart watch, a health or fitness tracker, a digital audio player (e.g., MP3 player), a camera, a game console, a medical device, implantable devices, industrial equipment, and many other devices sized, shaped, and configured for use by users.

Within the radio access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells. UEs may comprise a number of hardware structural components sized, shaped, and arranged to help in communication; such components can include antennas, antenna arrays, RF chains, amplifiers, one or more processors, etc. electrically coupled to each other.

In another example, a mobile network node (e.g., quadcopter 120) may be configured to function as a UE. For example, the quadcopter 120 may operate within cell 102 by communicating with base station 110. In some aspects of the present disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or traffic information (e.g., user data traffic) from a base station (e.g., base station 110) to one or more UEs (e.g., UEs 122 and 124) may be referred to as downlink (DL) transmission, while transmissions of control information and/or traffic information originating at a UE (e.g., UE 122) may be referred to as uplink (UL) transmissions. In addition, the uplink and/or downlink control information and/or traffic information may be time-divided into frames, subframes, slots, and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

The air interface in the radio access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), discrete Fourier transform spread orthogonal frequency division multiple access (DFT-s-OFDMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), discrete Fourier transform spread orthogonal frequency division multiplexing (DFT-s-OFDM) or other suitable multiplexing schemes.

Further, the air interface in the radio access network 100 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of an access and mobility management function (AMF), which may include a security context management function (SCMF) that manages the security context for both the control plane and the user plane functionality and a security anchor function (SEAF) that performs authentication. In various aspects of the disclosure, a radio access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe/slot timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the radio access network 100. Each of the cells may measure a strength of the pilot signal, and the radio access network (e.g., one or more of the base stations 110 and 114/116 and/or a central node within the core network) may determine a serving cell for the UE 124. As the UE 124 moves through the radio access network 100, the network may continue to monitor the uplink pilot signal transmitted by the UE 124. When the signal strength or quality of the pilot signal measured by a neighboring cell exceeds that of the signal strength or quality measured by the serving cell, the radio access network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, UEs or scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
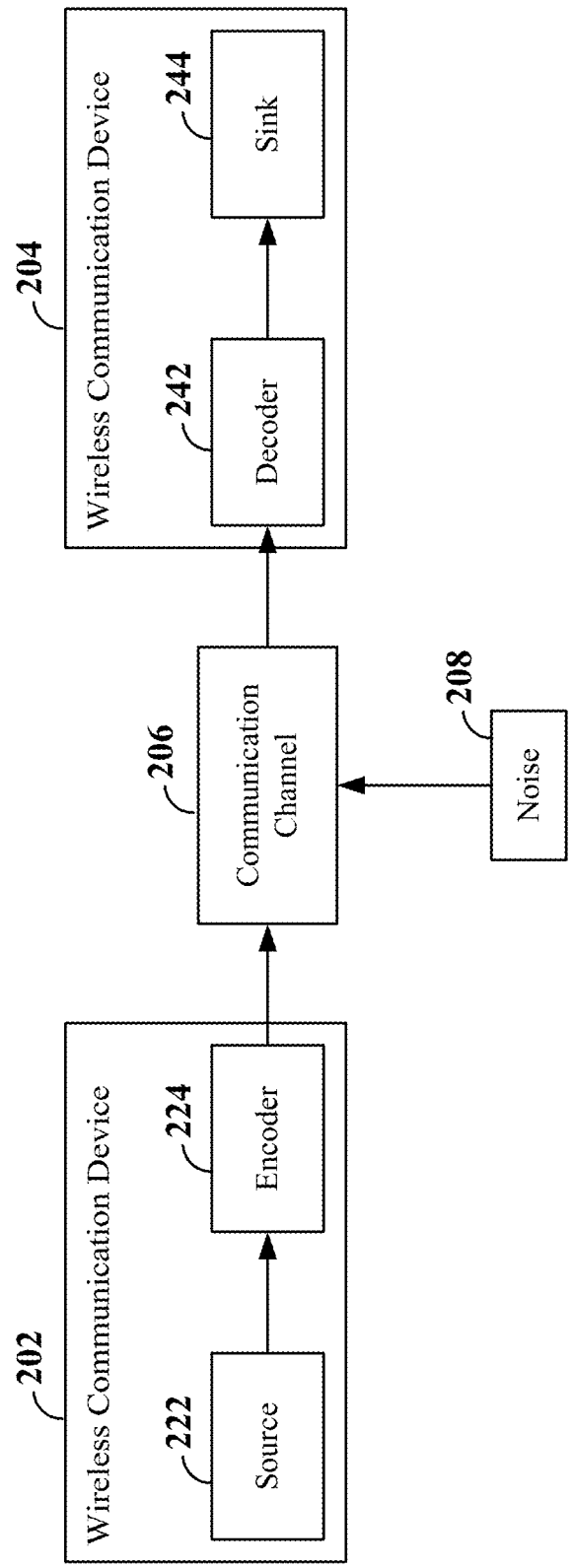
FIG. 2 is a schematic illustration of wireless communication utilizing block codes according to some aspects of the present disclosure.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, a source 222 within the first wireless communication device 202 transmits a digital message over a communication channel 206 (e.g., a wireless channel) to a sink 244 in the second wireless communication device 204. To provide for reliable communication of the digital message, it is usually beneficial to take into account the noise 208 that affects the communication channel 206.

Block codes, or error correcting codes are frequently used to provide reliable transmission of digital messages over such channels. In a typical block code, an information message or sequence is split up into blocks, each block having a length of K bits. An encoder 224 at the first (transmitting) wireless communication device 202 then mathematically adds redundancy to the information message, resulting in codewords having a length of N, where N>K. Here, the code rate R is the ratio between the message length and the block length: i.e., R=K/N. Exploitation of this redundancy in the encoded information message is one key to reliability of the message, possibly enabling correction for bit errors that may occur due to the noise 208 or other signal propagation affects. That is, a decoder 242 at the second (receiving) wireless communication device 204 can take advantage of the redundancy to possibly recover the information message even though bit errors may occur, in part, due to the addition of noise to the channel, etc.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes.

LDPC codes are linear forward error correcting codes, where each codeword of length N contains K information bits and C parity check bits (N=K+C). The symbols in an LDPC codeword satisfy C parity check equations of the form:

$$c_a \oplus c_b \oplus c_c \oplus \ldots \oplus c_z = 0,$$

where $c_a, c_b, c_c, \ldots, c_z$ are the code bits in the parity check equation and $\oplus$ refers to modulo 2 addition (e.g., an exclusive or operation).

LDPC codes may be defined by a sparse parity-check matrix H. A parity-check matrix is a C-row by N-column binary matrix. The rows represent the parity check equations and the columns represent the bits in the codeword. There is a "one" in the i-th row and j-th column if the j-th code bit is contained in the i-th parity check equation. The parity-check matrix is sparse in that the matrix has a low density of ones. This sparsity renders low complexity decoding and leads to a simple implementation.

An example of a parity-check matrix H is shown in FIG. 3. In the example shown in FIG. 3, the length (N) of the codeword is twelve and the number of parity check bits (C) is nine. Therefore, the parity-check matrix H is a 12×9 matrix, with nine parity check equations and twelve bits. Each parity check equation is formed from the code bits $c_1$-$c_{12}$ corresponding to the nonzero locations in each row. For example, the first parity check equation corresponding to the first row may be represented as $c_3 \oplus c_6 \oplus 7 \oplus c_8 = 0$. Thus, the first parity check equation includes the code bits $c_3, c_6, c_7$, and $c_8$ in the codeword. Similar equations may be constructed for each of the other rows based on the nonzero elements in each row. The matrix H shown in FIG. 3 represents a regular LDPC code in that every code bit is contained in the same number of equations and each equation contains the same number of code bits. For example, in FIG. 3, each code bit $c_1$-$c_{12}$ is contained in three equations and each equation contains four code bits. In other examples, the LDPC code may be irregular, which includes a variable number of ones in the rows and columns.

Figure 4:
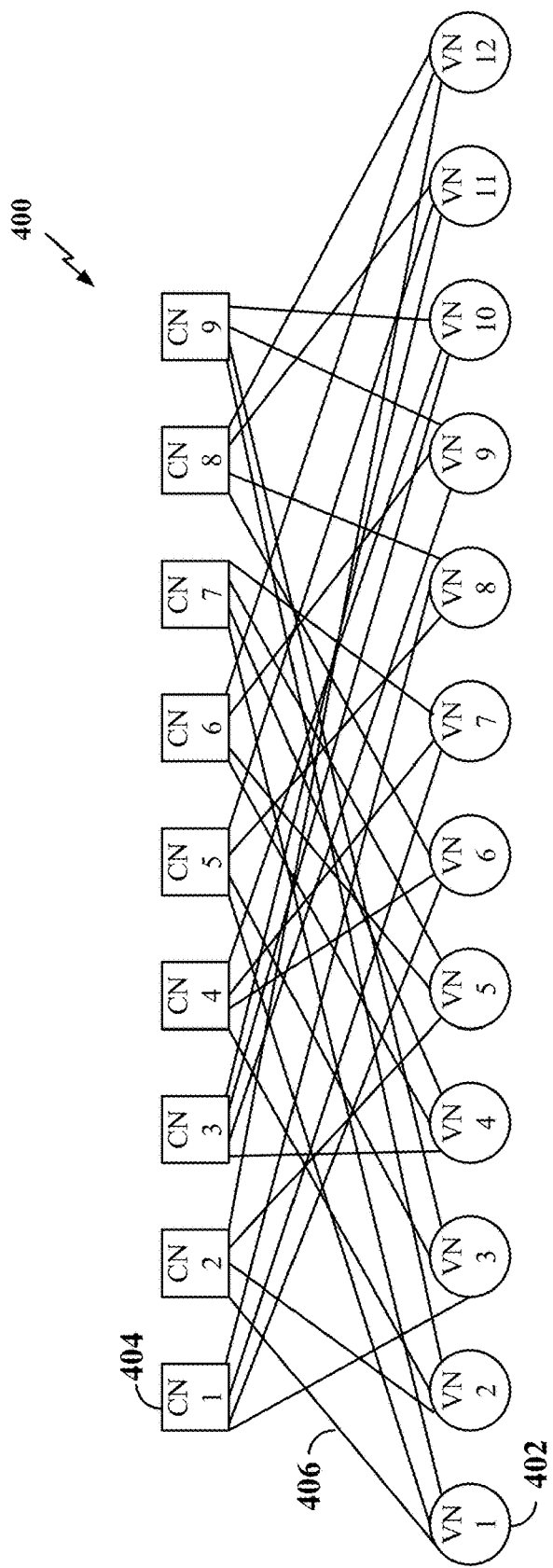
FIG. 4 illustrates an example of a LDPC base graph according to some aspects of the present disclosure.

Decoding of LDPC codes may best be understood by a graphical description. FIG. 4 illustrates an example of an LDPC graph 400 corresponding to the parity-check matrix H shown in FIG. 3. The graph 400 has two types of nodes: variable nodes (VN1-VN12) 402 and check nodes (CN1-CN9) 404. Each variable node represents a code bit and each check node represents a parity check equation. A line is drawn between a variable node and a check node if the code bit associated with the variable node is contained within the parity check equation associated with the check node. Each line may be referred to herein as an edge 406. Thus if a j-th variable node 402 is connected to an i-th check node 404 by an edge 406, i.e., the two nodes are neighbors, then there is a "1" in the i-th column and in the j-th row of the parity-check matrix H. That is, the intersection of an i-th row and a j-th column contains a "1" where an edge 406 joins the corresponding nodes 402 and 404 and a "0" where there is no edge. As such, each edge 406 corresponds to a non-zero element in the parity-check matrix.

The degree of a node refers to the number of edges connected to that node. This feature is illustrated in the H matrix shown in FIG. 4 where the number of edges incident to a variable node 402 is equal to the number of 1's in the corresponding column and is called the variable node degree d(v). Similarly, the number of edges connected with a check node 404 is equal to the number of ones in a corresponding row and is called the check node degree d(c). Since the graph shown in FIG. 4 corresponds to the parity-check matrix shown in FIG. 3, each variable node 402 has three edges 406 connecting it to check nodes 404 and each check node 404 has four edges 406 connecting it to variable nodes 402. A regular graph or code is one for which all variable nodes have the same degree, j, and all check nodes have the same degree, k. In this case, we say that the code is a (j, k) regular code. On the other hand, an irregular code has check nodes and/or variable nodes of differing degrees. For example, some variable nodes may be of degree 4, others of degree 3 and still others of degree 2.

A bit sequence associated one-to-one with the bit node sequence is a codeword of the code if and only if, for each check node 404, the bits neighboring the check node 404 (via their association with variable nodes 402) sum to zero modulo two, i.e., they comprise an even number of ones. In some cases, some of these bits might be punctured or known. Puncturing refers to the act of removing bits from a codeword to yield, in effect, a shorter codeword of a desired granularity. In the case of LDPC graphs, this means that some of the bit nodes 402 in the graph correspond to bits that are not actually transmitted. Puncturing a variable node 402 in an LDPC code creates a shortened code (e.g. due to the removal of a bit), while also effectively removing a check node 404. Specifically, for a matrix representation of an LDPC code, including bits to be punctured, where the variable node 402 to be punctured has a degree of one (such a representation may be possible through row combining provided the code is proper), puncturing the variable node 402 removes the associated bit from the code and effectively removes its single neighboring check node 404 from the graph. As a result, the number of check nodes 404 in the graph is reduced by one.

The LDPC decoder and decoding algorithm used to decode LDPC codewords operate by exchanging messages within the graph 400 along the edges 406 and updating these messages by performing computations at the nodes 402 and 404 based on the incoming messages. Each variable node 402 in the graph 400 is initially provided with a soft bit that indicates an estimate of the probability that the bit is a one, as determined by observations from, e.g., the communications channel (e.g., the channel estimate). The variable node 402 broadcasts this soft bit (initial estimate) to the check nodes 404 on the edges 406 connected to that variable node 402. Each check node 404, in turn, generates first new estimates for the bits involved in that parity check equation and sends back these first new estimates on the edges 406 back to the variable nodes 402. The first new estimates are calculated based upon all of the initial estimates furnished to the parity node.

For example, consider the first check node CN1 corresponding to the equation $c_3 \oplus c_6 \oplus 7 \oplus c_8 = 0$. This check node may receive initial estimates $e_3$, $e_6$, $e_7$, and $e_8$ from the variable nodes VN3, VN6, VN7, and VN8 corresponding to the code bits $c_3$, $c_6$, $c_7$, and $c_8$. The first new estimate for the variable node VN3 corresponding to code bit $c_3$ may then be calculated as:

$$e'_3 = e_6(1-e_7)(1-e_8) + e_7(1-e_6)(1-e_8) + e_8(1-e_6)(1-e_7) + e_6 e_7 e_8.$$

Similar calculations may be made for the new estimates for the remaining variable nodes.

As a result, each variable node 402 is provided different first new estimates by each of the check nodes 404 connected to it. Each variable node 402 may then determine a respective second new estimate for each of the check nodes 404 connected to it based on the original channel estimate together with a combination of the first new estimates received from each check node (except the check node to which the additional new estimate is sent). Thus, in determining the second new estimate sent from the variable node 402 to a check node 404, the variable node 402 ignores the first new estimate received from that check node 404. For example, variable node VN3 will ignore the first new estimate sent from check node CN1 when determining the second new estimate for check node CN1. The second new estimate for a particular check node may then be calculated, for example, as a normalized product of the first new estimates received from the other check nodes 404, taking into consideration the original channel estimate. This process repeats with check nodes 404 passing edge messages (estimates) to variable nodes 402 and variable nodes 402 passing edge messages (estimates) to check nodes 404 until a final estimate is computed at each variable node 402 by computing the normalized product of all of the estimates. A hard decision on each bit may then be made by comparing the final estimate with a threshold (e.g., 0.5).

In some examples, the graph 400 shown in FIG. 4 may be considered a base graph. As used herein, the term "base graph" refers to an LDPC graph having dimensions less than that necessary to produce the minimum codeword length utilized in a wireless communication network (e.g., the radio access network 100 shown in FIG. 1). To produce an LDPC graph corresponding to a desired information block length K and code rate R, each of the elements in the LDPC parity-check matrix representing the LDPC graph may be lifted (e.g., replaced with another matrix) by a lift size Z (e.g., $K_b * Z = K$. For example, if the base graph is represented by a 3×3 matrix and a lift size Z of three is applied to the base graph, the resulting lifted parity-check matrix is a 9×9 matrix to support a codeword having nine code bits (e.g., where each column in the matrix is associated with a set of three of the code bits). In effect, lifting is a technique for generating a relatively large LDPC code from multiple copies of a smaller base code. The largest lift size $Z_{max}$ represents the largest degree of parallelism that may be achieved per edge in the base graph, corresponding to the largest information block length $K_{max}$.

In some examples, construction of the lifted parity-check matrix may involve replacing each of the elements of the base parity-check matrix with a square submatrix of size Z×Z (the lift size), where each submatrix is either a cyclic-permutation of the identity matrix or a null submatrix. For example, for a submatrix size of 3×3, corresponding to a lift size of three, the submatrix $P_0$ may be the identity matrix and other submatrices $P_i$ may be obtained by cyclically-shifting the columns to the right by i elements.

Each element in the base parity-check matrix may then contain an identity of the lifted submatrix (e.g., $P_i$ or *, where * indicates a null matrix). If an element includes a lifted submatrix identity, then the set of bits associated with the column containing the element are cyclically shifted (rotated) by an amount corresponding to the submatrix identity. Using the above example of a lift size of three, there are three bits associated with each column, and if a particular element in a column contains $P_2$, the bits associated with that column would be shifted to the right by two bit positions. For example, the code bits [0 1 0] would be shifted to [1 0 0]. In some examples, the base parity-check matrix may support a maximum of twenty-two information bits (also referred to herein as systematic bits) with a maximum lift size of three-hundred eighty-four.

Figure 5:
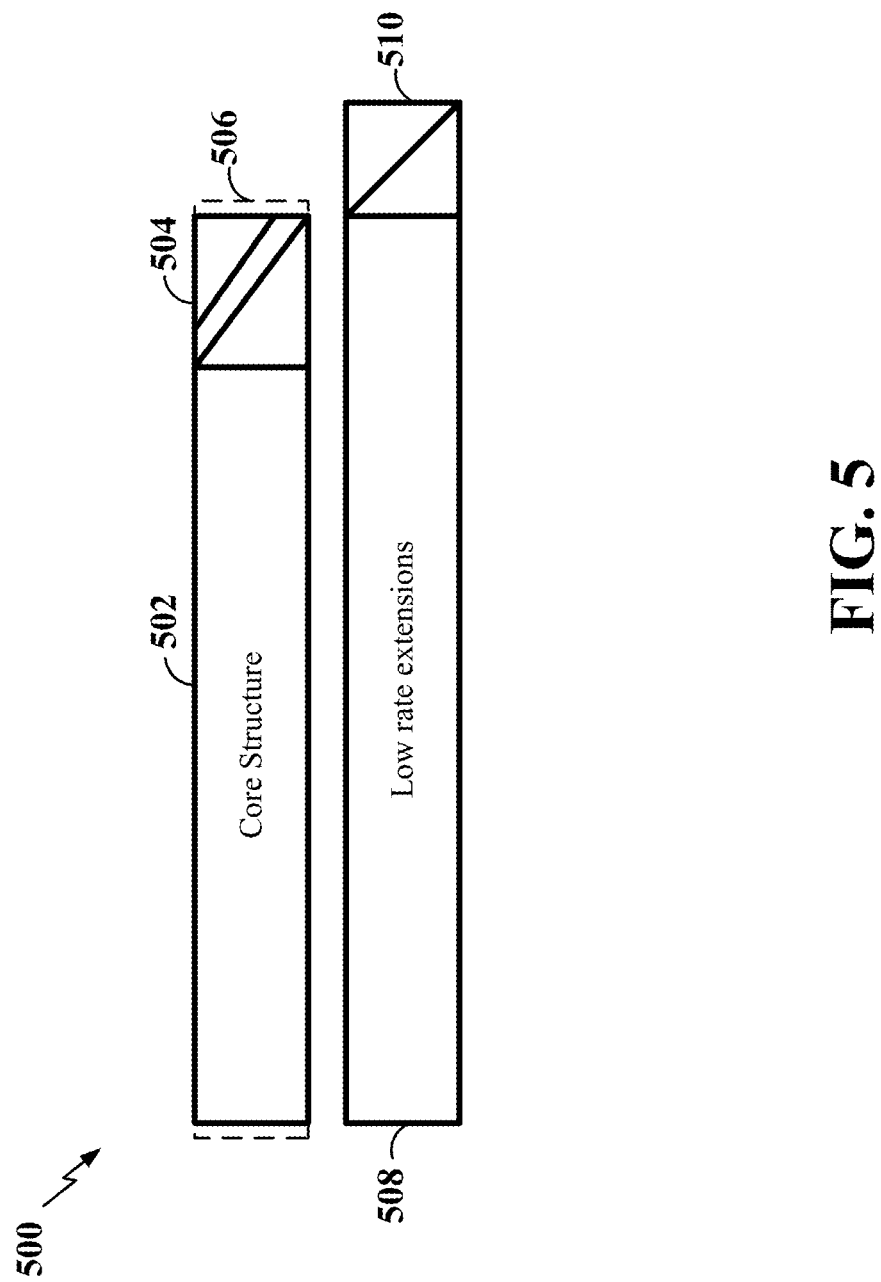
FIG. 5 illustrates a general structure of an exemplary base graph according to some aspects of the present disclosure.

FIG. 5 shows a general structure of an exemplary base graph (base parity-check matrix (P-matrix)) 500 that may be utilized for both LDPC encoding and LDPC decoding. The exemplary base graph 500 includes a core structure 502 with degree-three or higher variable nodes that forms the set of information (systematic) bit-columns. The base graph structure 500 further includes a parity structure 504, which includes an accumulated chain of degree-two parity bits. Alternate coding structures may be used, for example to support deeper error floors, and the disclosed techniques may be applied to such variations on the coding structure.

The portion of the base graph structure 500 including the core structure 502 and parity structure 504 may be referred to herein as a core graph 506. The core graph 506 has an associated code rate determined by its parameters. In some cases, some of the parity bits in the core graph 506 might be punctured to support coding rates above the rate of the core graph 506.

FIG. 5 also depicts low-rate extensions 508 and additional degree-one parity bits 510. While optional, the low-rate extensions 508 and degree-one parity bits 510 may extend the base graph for further incremental redundancy hybrid automatic repeat request (IR-HARQ) transmissions or, in general, for defining codes of lower rate than the rate associated with the core graph 506. The complete graph or some portion beyond the core graph may be referred to as an extended graph.

The core graph 506 has an associated code rate determined by its parameters. In some cases, some of the parity bits in the core graph 506 might be punctured to support coding rates above the rate of the core graph 506. Lower coding rates may be obtained by extending the core graph 506 with additional parity bits. In some examples, base graph design may be combined with a suitable set of lifting values to achieve fine granularity in block length (single-bit granularity). This granularity in the information block size may be achieved via shortening of the base graph and shortening of the lifted graph. The core graph 506 has associated with it a maximum number of information columns, denoted by $K_{b,max}$. When the base code is shortened, one or more information bits are declared known and they are not used in the transmitted code. This is typically accomplished by setting the known bit to 0. The receiver knows a priori the bits that are fixed to 0 and can exploit that knowledge in the decoding process. When a bit in the base graph 500 is known, the entire corresponding column of Z bits in the lifted graph is declared known. In parallel decoding architectures an entire known column can be skipped in the decoding process, so the known column incurs no operations at the receiver, hence the coding system can operate as if the base graph 500 were actually smaller. This does not typically apply to shortening that is less than an entire column. The shortening of the base graph 500 results in a range of supported information columns from a minimum value of $K_{b,min}$ up to a maximum value of $K_{b,max}$. The structure of the shortening guarantees that at most one lifted column of information bits of the lifted graph will be partially shortened. All other information bit columns are completely used or completely shortened, e.g., shortened at the base graph level.

In some examples, a tower of lift values may be defined as a discrete set $\{Z_1, Z_2, \ldots, Z_m\}$ where $Z_1$ denotes the minimum lift value and $Z_m$ denotes the maximum lift value. Selecting the numbers $K_{b,min}$ and $K_{b,max}$ so that the ratio $K_{b,max}/K_{b,min}$ is at least as large as the maximum value of $Z_{i+1}/Z_i$ for all values of i provides the basis for fine granularity in information block length. In addition to the information bits in the base graph, the base graph structure 500 can support a number of parity bits in the range from a minimum of $c_{b,min}$ to a maximum of $c_{b,max}$. As indicated above, the minimum may be less than the number of parity bits in the core graph 506 to support higher transmission rates. The maximum number of parity bits $c_{b,max}$ corresponds to the maximum number of the parity-bits in the extended graph and may be substantially larger.

Figure 6:
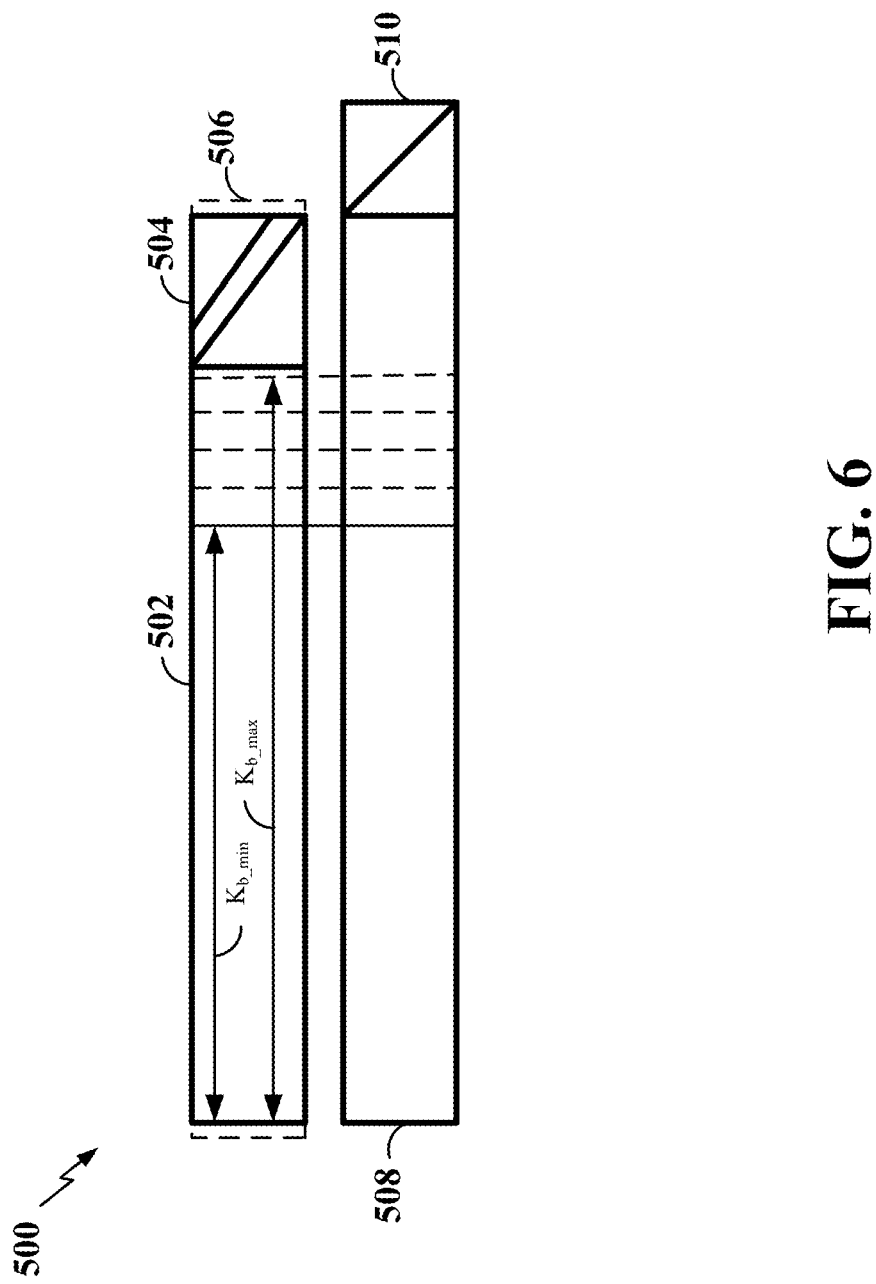
FIG. 6 illustrates a general structure of an exemplary optimized base graph, in accordance with some aspects of the present disclosure.

An exemplary technique for designing a base graph 500 may begin with optimizing a base graph with $K_{b,min}$ information bit-columns (for both the core and the extended base graph), as depicted in FIG. 6. The total number of parity bits (degree twos+one degree three+degree ones in the extended graph) is equal to $c_{b,max}$. $c_{b,min}$, which may be obtained by puncturing degree two parity bit columns in the core graph so that the base graph yields the desired highest possible coding rate.

Once the base graph 500 on $K_{b,min}$ information bit-columns is obtained, a column is added to the base graph 500 which optimizes the base graph for performance over $K_{b,min}+1$ information bit-columns. Adding bit-columns to the base graph 500 may be repeated in an iterative process until an optimized base graph on $K_{b,max}$ information bit-columns has been obtained. This nested optimization procedure is depicted in FIG. 6.

The numbers $K_{b,min}$, $K_{b,max}$ may be chosen such that $K_{b,max}/K_{b,min} \geq [Z_{i+1}/Z_i]$ for all values of i. The maximum rate and the minimum rate, which can support all block lengths in the range, are given by $R_{max}=K_{b,min}/(K_{b,min}-p_b+c_{b,min})$ and $R_{min}=K_{b,max}/(K_{b,max}-p_b+c_{b,max})$ where $p_b$ denotes the number of punctured information columns. In general, $c_{b,min}$ can be less than the number of parity bits in the core graph 506, because the design may support puncturing of core parity bits. If $c_{b,core}$ denotes the number of parity bits in the core graph 506, the core rate $R_{core}=K_{b,min}/(K_{b,min}-p_b+c_{b,core})$ may be defined as the highest rate that may be supported by all $K_{b,min} \leq K_b \leq K_{b,max}$ without puncturing core bits. Note that, in principle, $K_{b,min}$ may be very small, but then the performance of the code at the highest rate $R_{max}$ may degrade. Thus, in some examples, $K_{b,min}$ is large enough to provide desirable performance at the highest rate.

The technique of nested base graph construction described above ensures that for any $K_{b,min} \cdot Z_1 \leq K \leq K_{b,max} \cdot Z_m$ and any N, such that $R_{min} \leq K/N \leq R_{max}$, a code may be obtained from the base graph 500 that has desirable performance. In some examples, for any pair of lifts $Z_i$ and $Z_{i+1}$, $K_{b,min} \cdot Z_{i+1} \leq K_{b,max} \cdot Z_i$ by construction. Thus, as long as the desired information block length size K is in the range, $K_{b,min} \cdot Z_1 \leq K \leq K_{b,max} \cdot Z_m$, then there exists a $K_b$ in $K_{b,min} \leq K_b \leq K_{b,max}$ and a Zi in $Z_1 \leq Z_i \leq Z_m$ such that $K_b \cdot Z_i \leq K \leq K_b + 1) \cdot Z_i$. Thus, the desired information block length K may be obtained by using the base graph 500 with $K_b$ information bit-columns followed by shortening of at most $Z_i$ information bits. The parity bits may then be obtained by puncturing of at most $Z_i$ parity bits from the end. An exception to this may occur in the case where the number of base parity bits is fewer than the number of base core parity bits. In this case, it may be desirable to maintain all core parity bits in the description of the code and puncture as needed to achieve the desired code rate. Since the base graph 500 may be constructed using the nested procedure described above, the shortening and puncturing by at most $Z_i$ may still result in desirable performance.

The above optimized base graph structure 500, which may support code rates in the range $[R_{min}, R_{max}]$ and block lengths in the range $K_{b,min} \cdot Z_1 \leq K \leq K_{b,max} \cdot Z_m$, may be referred to as a family. Typically, the set of lifts in the family is a tower of clustered liftings, as previously described.

As described above, fine granularity of block lengths may be achieved by shortening of lifted base graphs. A higher-rate base graph may be extended to a lower rate by adding hybrid automatic repeat request (HARQ) extension bits 510 to the base graph. Performance may be achieved at all levels of extension. It is therefore possible to design LDPC codes covering many code rates and block lengths by starting with a single high-rate base graph (high-rate core graph 506) and adding a large HARQ extension 508/510.

As further described above, LDPC codes generated from a base graph structure 500, including the HARQ extension 508/510, that can support rates in the range $[R_{min}, R_{max}]$ and block lengths in the range $K_{b,min} \cdot Z_1 \leq K \leq K_{b,max} \cdot Z_m$ may be referred to as a family of codes. The set of lifts in the family can be a tower of clustered liftings, as described above.

Figure 7:
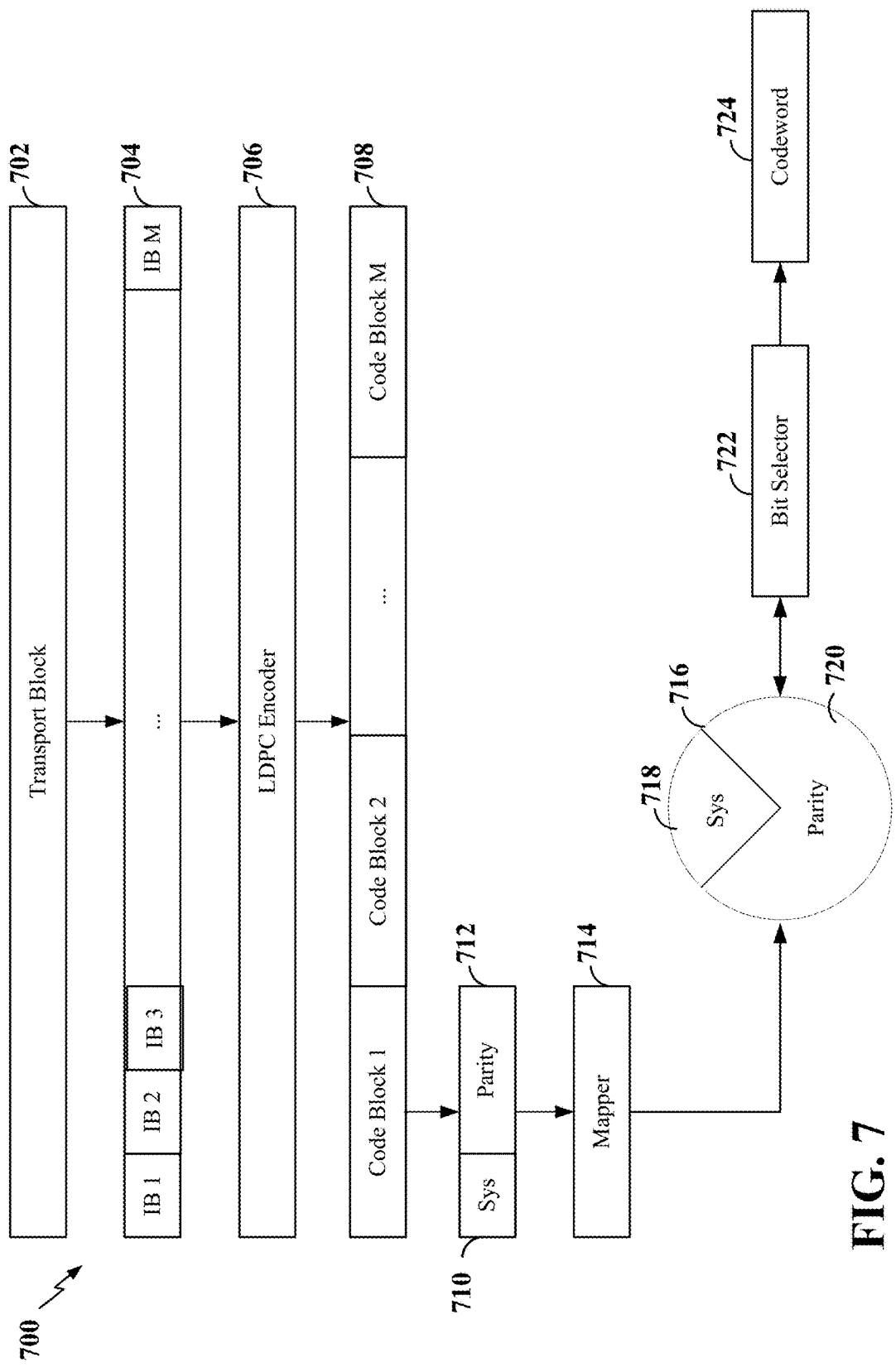
FIG. 7 illustrates an exemplary transmitting wireless communication device configured to generate and transmit codewords using an LDPC encoder and a circular buffer for rate matching, in accordance with some aspects of the present disclosure.

FIG. 7 is a conceptual diagram illustrating a transmitting wireless communication device 700 configured to generate and transmit codewords using an LDPC encoder 706. The transmitting wireless communication device 700 may segment a transport block 702 into M information blocks 704, each including a plurality of information bits (systematic bits). Each of the information blocks 704 may then be encoded by an LDPC encoder 706, using a PCM as described above, to produce M codewords 708, each corresponding to a respective one of the information blocks 704. Each codeword 708 includes systematic bits 710 and parity bits 712. In some examples, the parity bits 712 include parity 0 bits for the systematic bits and parity 1 bits for a known permutation of the systematic bits.

The systematic bits 710 and parity bits 712 of a codeword 708 may then be inserted into a circular buffer 716 by a mapper 714. For example, the mapper 714 may begin at a particular location in the circular buffer 716 and clockwise (or counterclockwise) insert the sequence of systematic bits 710 into the circular buffer to fill a first section 718 of the circular buffer 716. The mapper 714 may then insert the sequence of parity bits 712 into the remaining section 720 of the circular buffer until the end of the parity bit sequence is reached or section 720 of the circular buffer 716 is full (e.g., has no available space remaining). A bit selector 722 may then select bits in the circular buffer 716 to output as an initial redundancy version 724 of the codeword 708 for transmission to a receiving wireless communication device.

The circular buffer 716 is associated with a mother code rate, which may be defined herein as a ratio of number of systematic bits to the length of the circular buffer (i.e., number of systematic bits plus parity bits). The mother code rate is the original code rate of an LDPC code before puncturing and may be associated with a particular base graph (e.g., including HARQ extensions) and information block size (e.g., number of systematic bits). In some examples, the bit selector 722 may select a portion of the bits in the circular buffer 716 for the initial redundancy version 724 and may further perform rate matching or puncturing on the selected bits to generate the initial redundancy version 724 of the codeword 708 for transmission. In addition, the bit selector 722 may be configured to select bits from the circular buffer 716 for retransmission of one or more subsequent redundancy versions (RVs) when implementing IR-HARQ. In some examples, each RV may include the same number of coded bits. However, each RV may include, for example, different numbers of systematic bits 710 and parity bits 712. For example, one or more RVs may include fewer systematic bits 710 and more parity bits 712 than the initial redundancy version. This may be achieved by selecting different starting and ending points on the circular buffer 716 for each of the RVs.

In legacy (e.g., 4G) networks, the circular buffer 716 size (length) N is based on a fixed mother code rate, such as ⅓ (length) N is based on a fixed mother code rate, such as ⅓ or ⅕. In the example shown in FIG. 7, the mother code rate is equal to ⅓, and therefore, N=3*K. Thus, the first section 718 of the circular buffer 716 represents ⅓ of the length, while the second section 720 of the circular buffer 716 represent ⅔ of the length. Rate matching and RV's for IR-HARQ may then be defined based on this minimum (mother) code rate and maximum information block length. In some examples, RVs may be transmitted at lower code rates (e.g., including more parity bits), and therefore, the bit selector 722 may need to wrap around the circular buffer 716 multiple times to achieve the desired coding gain.

For LDPC codes, the decoder is limited by the maximum overall codeword size $N_{max}$, which is defined based on the maximum information block size ($K_{max}$) and the minimum code rate $R_{min}^*$ at the maximum information block size $K_{max}$ (e.g., $N_{max}=K_{max}/R_{min}^*$). In some examples, the mother code rate may be set equal to the minimum code rate $R_{min}^*$ and the length of the circular buffer 716 may be set to $N_{max}$.

LDPC decoders can further leverage lower mother code rates for $K<K_{max}$, as long as $K/R<N_{max}$. To accommodate lower mother code rates (e.g., mother code rates lower than $R_{min}^*$), various aspects of the present disclosure provide a configurable circular buffer. In some examples, the configurable circular buffer may further have a configurable length.

Figure 8:
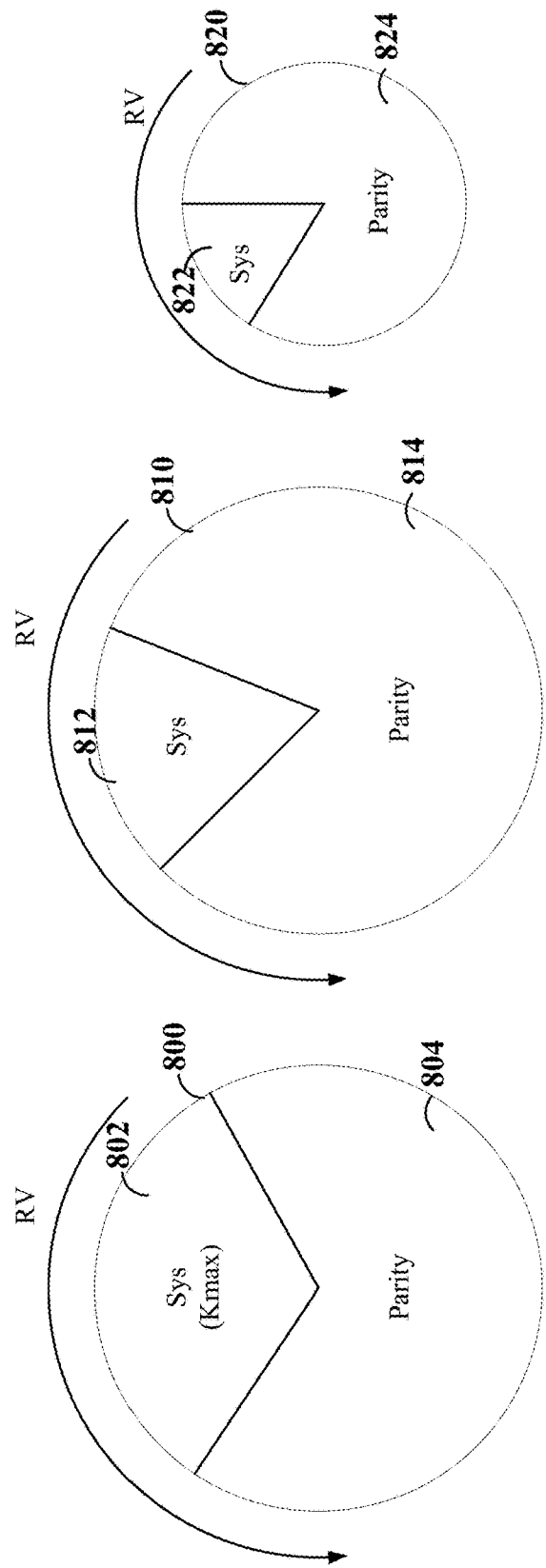
FIG. 8 illustrates exemplary configurable circular buffers, in accordance with some aspects of the present disclosure.

FIG. 8 illustrates circular buffers 800, 810 and 820 with varying (configurable) buffer lengths and/or varying systematic and parity bit section sizes to accommodate different mother code rates. The circular buffer may be configured, for example, based upon the information block size K and selected mother code rate $R_{mother}$. In some examples, the circular buffer configuration may be constrained by the maximum codeword length ($N_{max}$) and an absolute minimum mother code rate $R_{min\_absolute}$, corresponding to the code rate at which the coding gain has diminishing returns. For example, the absolute minimum mother code rate $R_{min\_absolute}$ may be ⅙ or 1/12. Thus, in some examples, the information block size K may be limited by the absolute minimum mother code rate $R_{min\_absolute}$ for a fixed length circular buffer. In other examples, the configurable circular buffer length (N*) may be limited by the absolute minimum mother code rate $R_{min\_absolute}$ for variable information block sizes K.

In some examples, a circular buffer (e.g., circular buffer 800, 810, or 820) may be defined based on a selected mother code rate that may be associated with a particular information block size and base graph. For example, a configurable circular buffer may be defined for a base graph selected from at least two base graph options based on the information block size. In some examples, the at least two base graph options may include a nested family of base graphs. In other examples, the least two base graph options may include base graphs having different ranges of graph dimensions (e.g., different ranges of numbers of bit nodes). In this example, each LDPC base graph may support a different information block length range (e.g., $K_{low}$ to $K_{high}$) based on the lift size. In addition, each information block length range may overlap. For example, at least one of the LDPC base graphs may include lower information block lengths than those included in the information block length range associated with a baseline LDPC base graph. Furthermore, one or more of the LDPC base graphs may utilize the maximum lift size $Z_{max}$ at smaller values of K ($K<K_{max}$).

In the examples shown in FIG. 8, a first circular buffer 800 may be defined for $K=K_{max}$. Thus, the length of the circular buffer 800 may be extended to $N_{max}$ to support up to a maximum codeword length ($N_{max}$) at the mother code rate of $R_{min}^*$. In some examples, $R_{min}^*$ is equal to ⅓, and thus the systematic bit section 802 of the circular buffer 800 represents ⅓ of the length, while the remaining parity bit section 804 of the circular buffer 800 represents ⅔ of the length. Rate matching and RV's may then be defined based on $R_{min}^*$ and $K_{max}$, where $N_{max}=K_{max}/R_{min}^*$.

Circular buffers 810 and 820 may be defined for $K<K_{max}$. For circular buffer 810, the length may still be defined as $N_{max}$ to support up to the maximum codeword length. However, the mother code rate $R_{mother}$ may be lower than $R_{min}^*$ (e.g., $R_{mother}<R_{min}^*$), thus producing different sizes for the systematic bit section 812 and parity bit section 814. In general, the systematic bit section 812 may represent less than ⅓ of the circular buffer length and the parity bit section 814 may represent more than ⅔ of the circular buffer length. In the example shown in FIG. 8, the circular buffer 810 is defined based on the absolute minimum mother code rate $R_{min\_absolute}$ of ⅙. Rate matching and RVs may then be defined based on K and $R_{min\_absolute}$.

For circular buffer 820, the length N* may be reduced based on the mother code rate $R_{mother}$, where $R_{mother}<R_{min}^*$. In addition, the sizes of the systematic and parity bit sections may also vary depending on $R_{mother}$. In the example shown in FIG. 8, the circular buffer 820 is defined based on the absolute minimum mother code rate $R_{min\_absolute}$ of ⅙, such that the systematic bit section 822 represents ⅙ of the length of the circular buffer 820, and the parity bit section 824 represents ⅚ of the length of the circular buffer 820. Rate matching and RVs may then be defined based on K and $R_{min\_absolute}$. A comparison of circular buffers 810 and 820 indicates that the starting and ending points for IR-HARQ may wrap around the circular buffer 820 more times than circular buffer 810.

Figure 9:
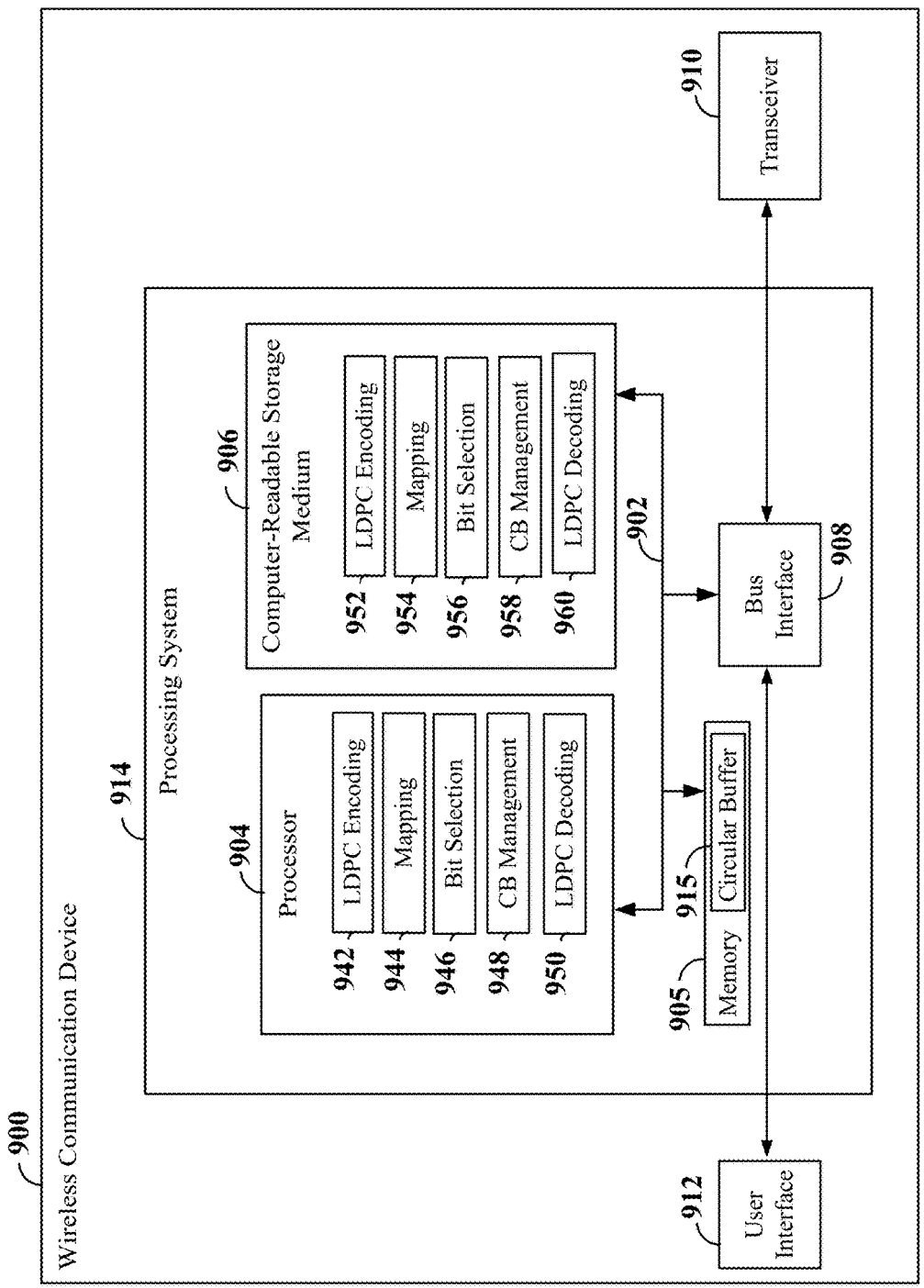
FIG. 9 is a block diagram illustrating an example of a hardware implementation for a wireless communication device employing a processing system, in accordance with some aspects of the present disclosure.

FIG. 9 is a conceptual diagram illustrating an example of a hardware implementation for an exemplary wireless communication device 900 employing a processing system 914. For example, the wireless communication device 900 may be a user equipment (UE), a base station as illustrated in any one or more of FIGS. 1 and 2, or any other suitable apparatus or means for wireless communication.

The wireless communication device 900 may be implemented with a processing system 914 that includes one or more processors 904. The term "processor" or "processors"

may be used herein according to the structural meaning thereof. Examples of processors 904 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In various examples, the wireless communication device 900 may be configured to perform any one or more of the functions described herein. That is, the processor 904, as utilized in a wireless communication device 900, may be used to implement any one or more of the processes described and illustrated herein. The processor 904 may in some instances be implemented via a baseband or modem chip and in other implementations, the processor 904 may itself comprise a number of devices distinct and different from a baseband or modem chip (e.g., in such scenarios is may work in concert to achieve embodiments discussed herein). And as mentioned above, various hardware arrangements and components outside of a baseband modem processor can be used in implementations, including RF-chains, power amplifiers, modulators, buffers, interleavers, adders/summers, etc.

In this example, the processing system 914 may be implemented with a bus architecture, represented generally by the bus 902. The bus 902 may include any number of interconnecting buses and bridges depending on the specific application of the processing system 914 and the overall design constraints. The bus 902 communicatively couples together various circuits including one or more processors (represented generally by the processor 904), a memory 905, and computer-readable media (represented generally by the computer-readable medium 906). The bus 902 may also link various other circuits such as timing sources, peripherals, voltage regulators, and power management circuits, which are well known in the art, and therefore, will not be described any further. A bus interface 908 provides an interface between the bus 902 and a transceiver 910. The transceiver 910 provides a means for communicating with various other apparatus over a transmission medium (e.g., air). Depending upon the nature of the apparatus, a user interface 912 (e.g., keypad, display, speaker, microphone, joystick) may also be provided.

The processor 904 is responsible for managing the bus 902 and general processing, including the execution of software stored on the computer-readable medium 906. The software, when executed by the processor 904, causes the processing system 914 to perform the various functions described below for any particular apparatus. The computer-readable medium 906 and the memory 905 may also be used for storing data that is manipulated by the processor 904 when executing software. In some examples, the computer-readable medium 906 may be integrated with the memory 905.

One or more processors 904 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on the computer-readable medium 906.

The computer-readable medium 906 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 906 may also include, by way of example, a carrier wave, a transmission line, and any other suitable medium for transmitting software and/or instructions that may be accessed and read by a computer.

The computer-readable medium 906 may reside in the processing system 914, external to the processing system 914, or distributed across multiple entities including the processing system 914. The computer-readable medium 906 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 904 may include circuitry configured for various functions. For example, the processor 904 may include low density parity check (LDPC) encoding circuitry 942 configured to receive an information block of a given block length and to encode the information block using LDPC encoding based on a particular code rate to produce a codeword. The codeword contains the information bits (systematic bits) of the information block and parity bits generated using LDPC encoding.

The LDPC encoding circuitry 942 may further select an LDPC base graph to utilize for LDPC coding of the information block based on, for example, the information block size of the information block. For example, the LDPC base graph may be selected from at least two base graph options. In some examples, the at least two base graph options may include a nested family of base graphs. In other examples, the least two base graph options may include base graphs having different ranges of graph dimensions (e.g., different ranges of numbers of bit nodes). In this example, each LDPC base graph may support a different information block length range (e.g., $K_{low}$ to $K_{high}$) based on the lift size. In addition, each information block length range may overlap. For example, at least one of the LDPC base graphs may include lower information block lengths than those included in the information block length range associated with a baseline LDPC base graph. Furthermore, one or more of the LDPC base graphs may utilize the maximum lift size $Z_{max}$ at smaller values of K ($K<K_{max}$). The LDPC encoding circuitry 942 may operate in coordination with LDPC encoding software 952.

The processor 904 may further include mapping circuitry 944 configured to insert the systematic bits and parity bits of the codeword into a circular buffer 915 maintained, for example, in memory 905. For example, the mapping circuitry 944 may begin at a particular location in the circular buffer 915 and clockwise (or counterclockwise) insert the sequence of systematic bits from the codeword into the circular buffer to fill a systematic bit section of the circular buffer 915. The mapping circuitry 944 may then insert the sequence of parity bits from the codeword into the remaining sections of the circular buffer until the end of the parity bit sequence is reached or the circular buffer 716 has no available space remaining. The mapping circuitry 944 may operate in coordination with mapping software 954.

The processor 904 may further include bit selection circuitry 946 configured to select bits in the circular buffer 915 to output as an initial redundancy version for transmission over a wireless air interface to a receiving wireless communication device via the transceiver 910. In some examples, the bit selection circuitry 946 may select all of the bits in the circular buffer 915 for transmission as the initial redundancy version. In other examples, the bit selection circuitry 946 may perform rate matching or puncturing to select a portion of the bits in the circular buffer 915 for transmission as the initial redundancy version. In addition, the bit selection circuitry 946 may be configured to retransmit one or more subsequent redundancy versions (RVs) when implementing IR-HARQ. Each RV may include the same number of coded bits.

However, each RV may include, for example, different numbers of systematic bits and parity bits. For example, one or more subsequent RVs may include fewer systematic bits and more parity bits than the initial redundancy version. The bit selection circuitry 946 may operate in coordination with bit selection software 956.

The processor 904 may further include circular buffer (CB) management circuitry 948 configured to define the circular buffer 915 and maintain the circular buffer 915, for example, in memory 905. The CB management circuitry 948 may define the length of the circular buffer 915 and/or the respective sizes of the systematic bit and parity bit sections of the circular buffer 915 based on a selected mother code rate. In some examples, the CB management circuitry 948 may define the circular buffer based on the selected mother code rate that may be associated with a particular information block size K and base graph. For example, the circular buffer may be defined for a base graph selected from at least two base graph options based on the information block length K.

For example, when $K=K_{max}$, the CB management circuitry 948 may define the circular buffer 915 to have a length of $N_{max}$ at the mother code rate of $R_{min}^*$. In some examples, $R_{min}^*$ is equal to ⅓, and thus the systematic bit section of the circular buffer 915 represents ⅓ of the length, while the remaining parity bit section of the circular buffer 915 represents ⅔ of the length.

For K<K, the CB management circuitry 948 may define the circular buffer 915 at a mother code rate R mother less than $R_{min}^*$. The circular buffer may be bound by the maximum codeword size $N_{max}$ and an absolute minimum mother code rate $R_{min\_absolute}$, corresponding to the code rate at which the coding gain has diminishing returns. For example, the absolute minimum mother code rate $R_{min\_absolute}$ may be ⅙ or 1/12.

In some examples, the CB management circuitry 948 may define the circular buffer 915 to have a fixed length of $N_{max}$ at the selected mother code rate $R_{mother}$, which may be less than or equal to $R_{min}^*$, thus producing different sizes for the systematic bit and parity bit sections of the circular buffer 915 based on the selected mother code rate. In general, the systematic bit section may represent less than ⅓ of the circular buffer length and the parity bit section may represent more than ⅔ of the circular buffer length.

In other examples, the CB management circuitry 948 may define the circular buffer 915 to have a configurable length N*, which may be less than or equal to $N_{max}$. In addition, the respective sizes of the systematic and parity bit sections of the circular buffer 915 may vary depending on the selected mother code rate $R_{mother}$, which may be less than or equal to $R_{min}^*$. The CB management circuitry 948 may operate in coordination with CB management software 958.

The processor 904 may further include LDPC decoding circuitry 950 configured to receive one or more redundancy versions of a codeword over a wireless air interface from a transmitting wireless communication device via the transceiver 910 and decode the codeword utilizing LDPC decoding to produce an information block of a given block length. In some examples, the LDPC decoding circuitry 950 may be configured to decode the codeword utilizing the circular buffer 915 configured by the CB management circuitry 948, as described above. For example, the circular buffer 915 may be utilized when implementing IR-HARQ to determine the received coded bits that overlap between RVs (e.g., based on starting and ending points on the circular buffer for the first transmission and each RV), combine the overlapping coded bits, extend the codeword based on the new parity bits received in each RV, and decode the extended codeword. The LDPC decoding circuitry 950 may operate in coordination with LDPC decoding software 960.

Figure 10:
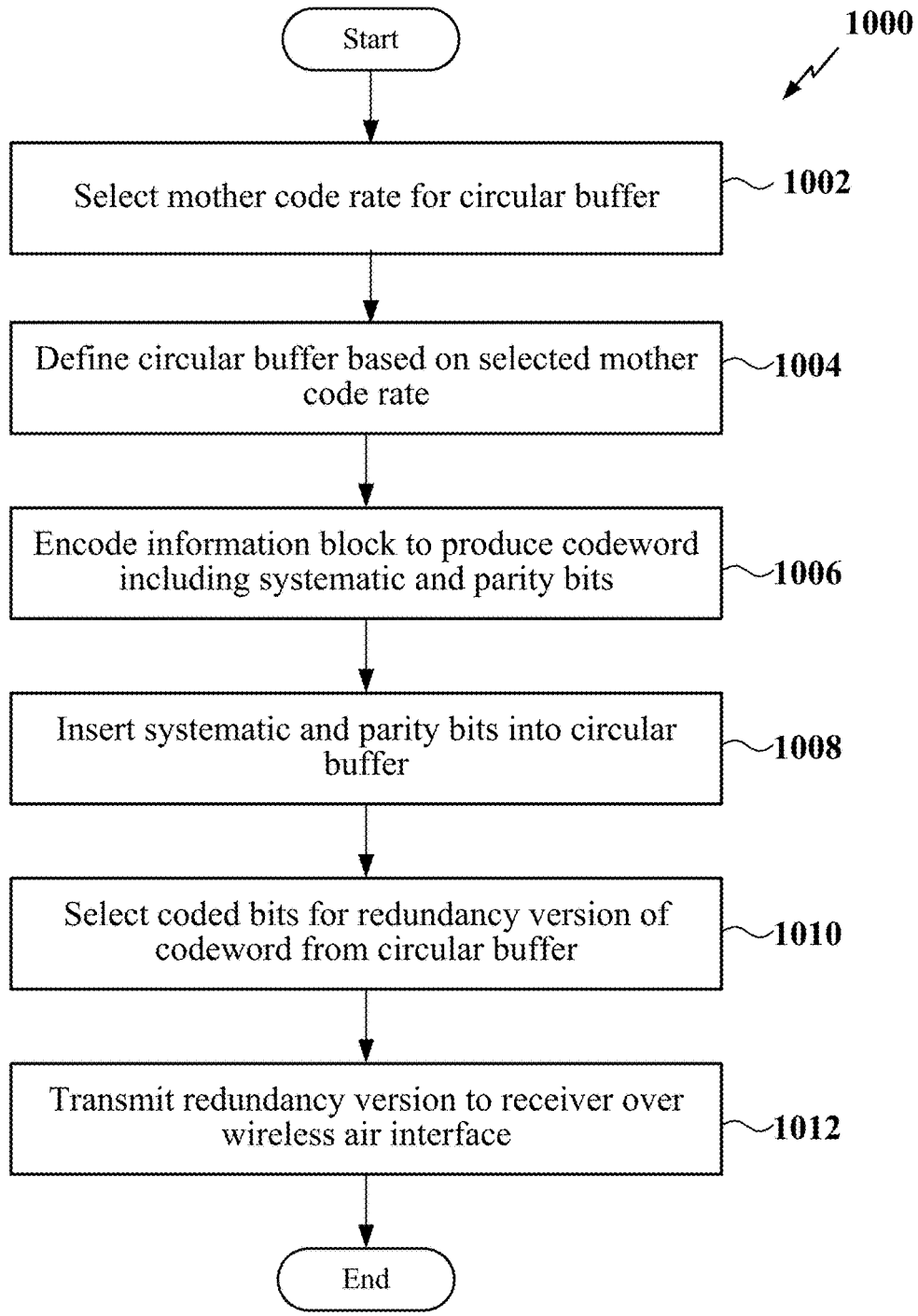
FIG. 10 is a flow chart of a method for LDPC encoding utilizing a configurable circular buffer, in accordance with some aspects of the present disclosure.

FIG. 10 is a flow chart illustrating an exemplary process 1000 for low density parity check (LDPC) coding in accordance with some aspects of the present disclosure. As described below, some or all illustrated features may be omitted in a particular implementation within the scope of the present disclosure, and some illustrated features may not be required for implementation of all embodiments. In some examples, the process 1000 may be carried out by the wireless communication device illustrated in FIGS. 1, 2, 7 and/or 9. In some examples, the process 1000 may be carried out by any suitable apparatus or means for carrying out the functions or algorithm described below.

At block 1002, the wireless communication device may select a mother code rate for a circular buffer. In some examples, the mother code rate may be selected from at least two mother code rates, and may be determined based on a given information block size and a selected LDPC base graph. In some examples, the LDPC base graph may be selected from two or more LDPC base graphs based on, for example, the information block size. In some examples, the mother code rate may be any code rate between a minimum code rate ($R_{min}^*$), which corresponds to the maximum information block size ($K_{max}$) and maximum codeword length ($N_{max}$), and an absolute minimum mother code rate $R_{min\_absolute}$ at which coding gains diminish. For example, the mother code rate may be ⅓, ⅙, 1/12 or other suitable code rate. For example, the CB management circuitry 948 shown and described above in reference to FIG. 9 may determine the mother code rate.

At block 1004, the wireless communication device may define a circular buffer based on the selected mother code rate. In some examples, the circular buffer may be defined by setting a length of the circular buffer equal to a maximum length corresponding to a maximum codeword size when the information block size of the information block is equal to a maximum information block size. In other examples, the circular buffer may be defined by setting the length of the circular buffer equal to the information block size of the information block divided by the selected mother code rate. The circular buffer may further be defined by configuring the respective sizes of a systematic bit section and a parity bit section of the circular buffer based on the selected mother code rate. For example, the circular buffer may be defined by providing a fixed length circular buffer (e.g., corresponding to the maximum codeword size) and varying the respective sizes of the systematic bit and parity bit sections based on the selected mother code rate. For example, the CB management circuitry 948 shown and described above in reference to FIG. 9 may define the circular buffer.

At block 1006, the wireless communication device may receive an information block and encode the information block using LDPC coding to produce a codeword. The codeword may include, for example, systematic bits (e.g., information bits of the information block) and parity bits generated from the LDPC encoding process. In some examples, the codeword may be generated utilizing an LDPC base graph selected from two or more LDPC base graphs, where each LDPC base graph may be associated with a different mother code rate, as indicated above. For example, the LDPC encoding circuitry 942 shown and described above in reference to FIG. 9 may encode the information block.

At block 1008, the wireless communication device may insert the systematic bits of the codeword into the systematic bit section of the circular buffer and the parity bits of the codeword into the parity bit section of the circular buffer. In some examples, the wireless communication device may begin at a particular location in the circular buffer and clockwise (or counterclockwise) insert the sequence of systematic bits into the circular buffer to fill the systematic bit section of the circular buffer, and then insert the sequence of parity bits into the parity bit section of the circular buffer. For example, the mapping circuitry 944 shown and described above in reference to FIG. 9 may insert the systematic and parity bits into the circular buffer.

At block 1010, the wireless communication may select coded bits for inclusion in a redundancy version of the codeword from the systematic bits in the systematic bit section and parity bits in the parity bit section. For example, for the first (initial) redundancy version, the wireless communication device may select all of the systematic bits and parity bits or only a portion of the systematic bits and/or parity bits. For IR-HARQ, one or more subsequent redundancy versions of the codeword may be transmitted that include fewer systematic bits and more parity bits (e.g., by starting and ending at different points on the circular buffer than the first transmission). For example, the bit selection circuitry 946 shown and described above in reference to FIG. 9 may select the coded bits for the redundancy version of the codeword from the circular buffer.

At block 1012, the wireless communication device may transmit the redundancy version of the codeword over a wireless air interface to the receiver (e.g., a receiving wireless communication device). For example, the transceiver 910 shown and described above in reference to FIG. 9 may transmit the codeword to the receiving wireless communication device.

Figure 11:
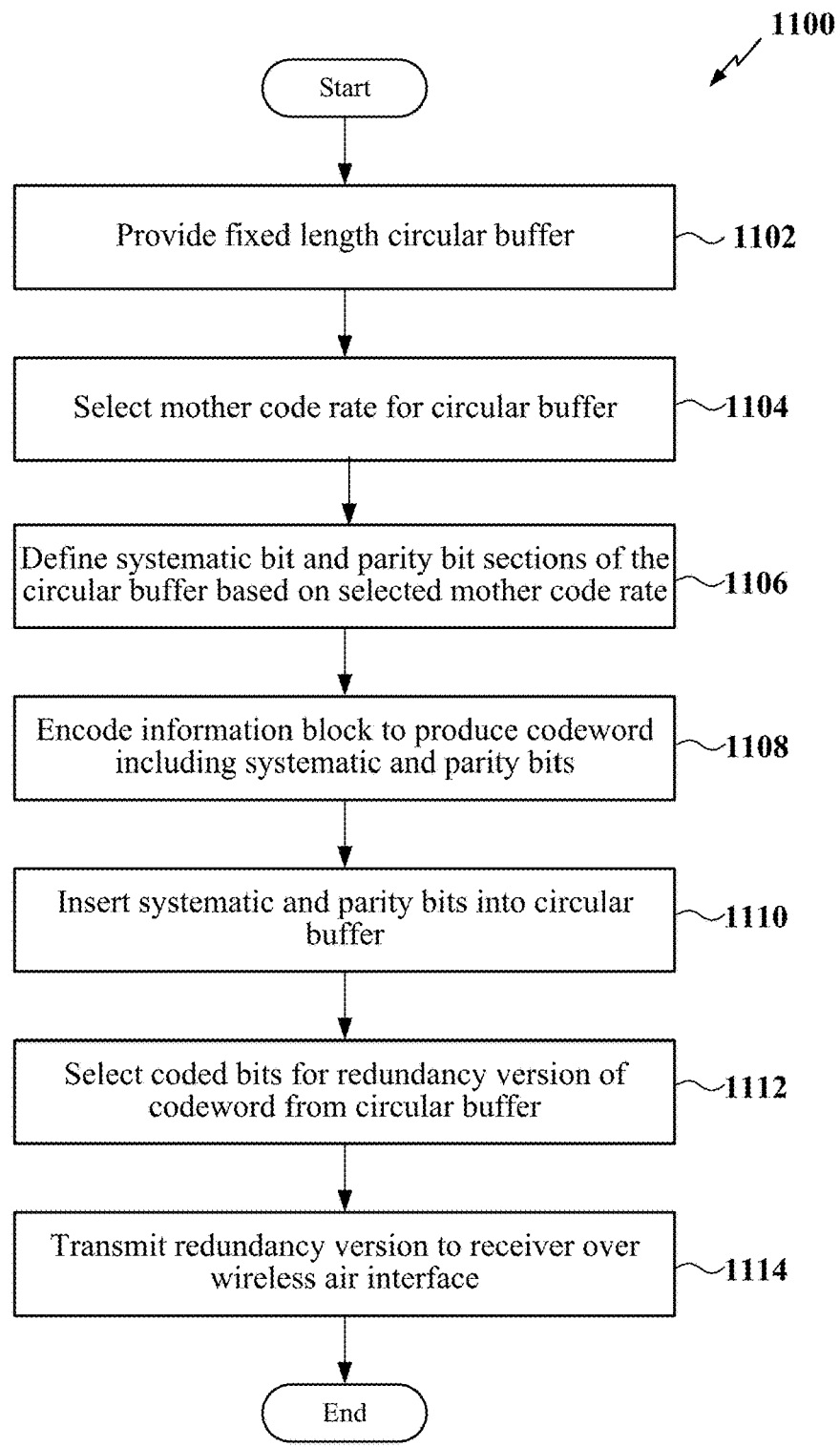
FIG. 11 is a flow chart of another method for LDPC encoding utilizing a configurable circular buffer, in accordance with some aspects of the present disclosure.

FIG. 11 is a flow chart illustrating another exemplary process 1100 for low density parity check (LDPC) coding in accordance with some aspects of the present disclosure. As described below, some or all illustrated features may be omitted in a particular implementation within the scope of the present disclosure, and some illustrated features may not be required for implementation of all embodiments. In some examples, the process 1100 may be carried out by the wireless communication device illustrated in FIGS. 1, 2, 7 and/or 9. In some examples, the process 1100 may be carried out by any suitable apparatus or means for carrying out the functions or algorithm described below.

At block 1102, the wireless communication device may provide a fixed length circular buffer. For example, the fixed length of the circular buffer may be set equal to a maximum length corresponding to a maximum codeword length. For example, the fixed length circular buffer may be implemented in hardware within the memory 905 shown and described above in reference to FIG. 9.

At block 1104, the wireless communication device may select a mother code rate for a circular buffer. In some examples, the mother code rate may be selected from at least two mother code rates, and may be determined based on a given information block size and a selected LDPC base graph. In some examples, the LDPC base graph may be selected from two or more LDPC base graphs based on, for example, the information block size. In some examples, the mother code rate may be any code rate between a minimum code rate ($R_{min}^*$), which corresponds to the maximum information block size ($K_{max}$) and maximum codeword length ($N_{max}$), and an absolute minimum mother code rate $R_{min\_absolute}$ at which coding gains diminish. For example, the mother code rate may be ⅓, ⅙, 1/12 or other suitable code rate. For example, the CB management circuitry 948 shown and described above in reference to FIG. 9 may determine the mother code rate.

At block 1106, the wireless communication device may define respective sizes of a systematic bit section and a parity bit section of the circular buffer based on the selected mother code rate. For example, the respective sizes of the systematic bit section and the parity bit section may be defined based on the information block size of the information block. For example, the CB management circuitry 948 shown and described above in reference to FIG. 9 may define the circular buffer.

At block 1108, the wireless communication device may receive an information block and encode the information block using LDPC coding to produce a codeword. The codeword may include, for example, systematic bits (e.g., information bits of the information block) and parity bits generated from the LDPC encoding process. In some examples, the codeword may be generated utilizing an LDPC base graph selected from two or more LDPC base graphs, where each LDPC base graph may be associated with a different mother code rate, as indicated above. For example, the LDPC encoding circuitry 942 shown and described above in reference to FIG. 9 may encode the information block.

At block 1110, the wireless communication device may insert the systematic bits of the codeword into the systematic bit section of the circular buffer and the parity bits of the codeword into the parity bit section of the circular buffer. In some examples, the wireless communication device may begin at a particular location in the circular buffer and clockwise (or counterclockwise) insert the sequence of systematic bits into the circular buffer to fill the systematic bit section of the circular buffer, and then insert the sequence of parity bits into the parity bit section of the circular buffer. For example, the mapping circuitry 944 shown and described above in reference to FIG. 9 may insert the systematic and parity bits into the circular buffer.

At block 1112, the wireless communication may select coded bits for inclusion in a redundancy version of the codeword from the systematic bits in the systematic bit section and parity bits in the parity bit section. For example, for the first (initial) redundancy version, the wireless communication device may select all of the systematic bits and parity bits or only a portion of the systematic bits and/or parity bits. For IR-HARQ, one or more subsequent redundancy versions of the codeword may be transmitted that include fewer systematic bits and more parity bits (e.g., by starting and ending at different points on the circular buffer than the first transmission). For example, the bit selection circuitry 946 shown and described above in reference to FIG. 9 may select the coded bits for the redundancy version of the codeword from the circular buffer.

At block 1114, the wireless communication device may transmit the redundancy version of the codeword over a wireless air interface to the receiver (e.g., a receiving wireless communication device). For example, the transceiver 910 shown and described above in reference to FIG. 9 may transmit the codeword to the receiving wireless communication device.

Figure 12:
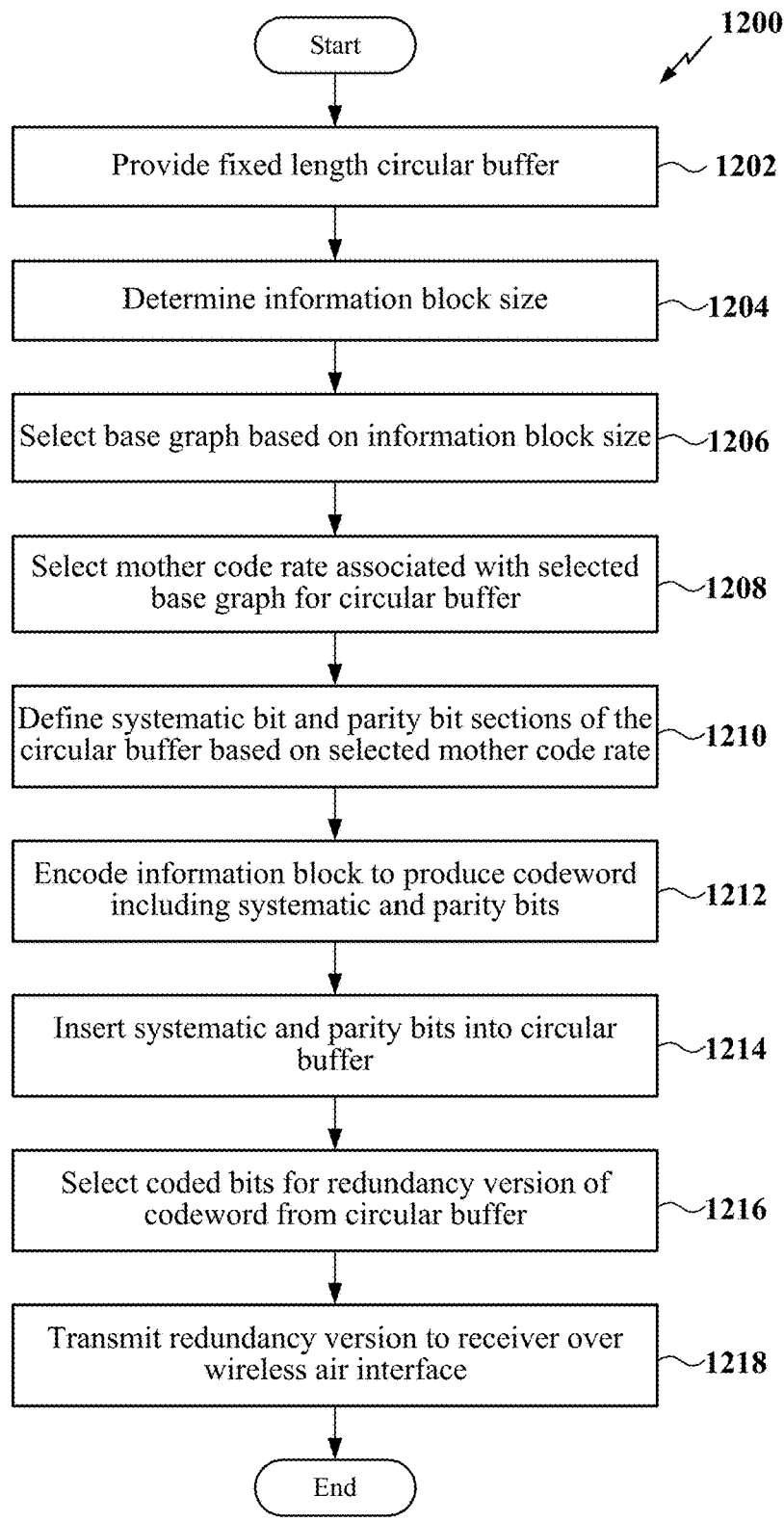
FIG. 12 is a flow chart of another method for LDPC encoding utilizing a configurable circular buffer, in accordance with some aspects of the present disclosure.

FIG. 12 is a flow chart illustrating another exemplary process 1200 for low density parity check (LDPC) coding in accordance with some aspects of the present disclosure. As described below, some or all illustrated features may be omitted in a particular implementation within the scope of the present disclosure, and some illustrated features may not be required for implementation of all embodiments. In some examples, the process 1200 may be carried out by the wireless communication device illustrated in FIGS. 1, 2, 7 and/or 9. In some examples, the process 1200 may be carried out by any suitable apparatus or means for carrying out the functions or algorithm described below.

At block 1202, the wireless communication device may provide a fixed length circular buffer. For example, the fixed length of the circular buffer may be set equal to a maximum length corresponding to a maximum codeword length. For example, the fixed length circular buffer may be implemented in hardware within the memory 905 shown and described above in reference to FIG. 9.

At block 1204, the wireless communication device may determine an information block size (length) of an information block to be encoded. In some examples, the information block size may be selected based on an absolute minimum mother code rate $R_{min\_absolute}$ and the fixed length of the circular buffer. For example, the LDPC encoding circuitry 942 shown and described above in reference to FIG. 9 may determine the information block size.

At block 1206, the wireless communication device may select a base graph for encoding an information block based on the information block size determined at 1204. For example, the LDPC base graph may be selected from at least two base graph options. In some examples, the at least two base graph options may include a nested family of base graphs. In other examples, the least two base graph options may include base graphs having different ranges of graph dimensions (e.g., different ranges of numbers of bit nodes). In this example, each LDPC base graph may support a different information block length range (e.g., $K_{low}$ to $K_{high}$) based on the lift size. In addition, each information block length range may overlap. For example, at least one of the LDPC base graphs may include lower information block lengths than those included in the information block length range associated with a baseline LDPC base graph. Furthermore, one or more of the LDPC base graphs may utilize the maximum lift size $Z_{max}$ at smaller values of K ($K<K_{max}$). For example, the LDPC encoding circuitry 942 shown and described above in reference to FIG. 9 may select the LDPC base graph.

At block 1208, the wireless communication device may select a mother code rate for a circular buffer. In some examples, the mother code rate may be selected from at least two mother code rates, and may be determined based on the determined information block size and the selected LDPC base graph. In some examples, the mother code rate may be any code rate between a minimum code rate ($R_{min}^*$), which corresponds to the maximum information block size ($K_{max}$) and maximum codeword length ($N_{max}$), and the absolute minimum mother code rate $R_{min\_absolute}$ at which coding gains diminish. For example, the mother code rate may be $\frac{1}{3}$, $\frac{1}{6}$, $\frac{1}{12}$ or other suitable code rate. For example, the CB management circuitry 948 shown and described above in reference to FIG. 9 may determine the mother code rate.

At block 1210, the wireless communication device may define respective sizes of a systematic bit section and a parity bit section of the circular buffer based on the selected mother code rate. For example, the respective sizes of the systematic bit section and the parity bit section may be defined based on the information block size of the information block. For example, the CB management circuitry 948 shown and described above in reference to FIG. 9 may define the circular buffer.

At block 1212, the wireless communication device may receive an information block and encode the information block using the selected LDPC base graph to produce a codeword. The codeword may include, for example, systematic bits (e.g., information bits of the information block) and parity bits generated from the LDPC encoding process. For example, the LDPC encoding circuitry 942 shown and described above in reference to FIG. 9 may encode the information block.

At block 1214, the wireless communication device may insert the systematic bits of the codeword into the systematic bit section of the circular buffer and the parity bits of the codeword into the parity bit section of the circular buffer. In some examples, the wireless communication device may begin at a particular location in the circular buffer and clockwise (or counterclockwise) insert the sequence of systematic bits into the circular buffer to fill the systematic bit section of the circular buffer, and then insert the sequence of parity bits into the parity bit section of the circular buffer. For example, the mapping circuitry 944 shown and described above in reference to FIG. 9 may insert the systematic and parity bits into the circular buffer.

At block 1216, the wireless communication may select coded bits for inclusion in a redundancy version of the codeword from the systematic bits in the systematic bit section and parity bits in the parity bit section. For example, for the first (initial) redundancy version, the wireless communication device may select all of the systematic bits and parity bits or only a portion of the systematic bits and/or parity bits. For IR-HARQ, one or more subsequent redundancy versions of the codeword may be transmitted that include fewer systematic bits and more parity bits (e.g., by starting and ending at different points on the circular buffer than the first transmission). For example, the bit selection circuitry 946 shown and described above in reference to FIG. 9 may select the coded bits for the redundancy version of the codeword from the circular buffer.

At block 1218, the wireless communication device may transmit the redundancy version of the codeword over a wireless air interface to the receiver (e.g., a receiving wireless communication device). For example, the transceiver 910 shown and described above in reference to FIG. 9 may transmit the codeword to the receiving wireless communication device.

In one configuration, a wireless communication device includes means for defining a circular buffer based on a selected mother code rate selected from at least two mother code rates, where the circular buffer includes a fixed length and further includes a systematic bit section and a parity bit section. The wireless communication device further includes means for encoding an information block utilizing LDPC coding to produce a codeword including systematic bits and parity bits, means for inserting the systematic bits into the systematic bit section and the parity bits into the parity bit section, means for selecting coded bits for inclusion in a redundancy version of the codeword from the systematic bits in the systematic bit section and the parity bits in the parity bit section, and means for transmitting the redundancy version of the codeword over a wireless air interface.

In one aspect, the aforementioned means may be the processor(s) 904 shown in FIG. 9 configured to perform the functions recited by the aforementioned means. For example, the aforementioned means for defining the circular buffer may include the CB management circuitry 948 shown in FIG. 9. In another aspect, the aforementioned means for encoding the information block may include the LDPC encoding circuitry 942 shown in FIG. 9. In still another aspect, the aforementioned means for inserting the systematic bits and parity bits into the circular buffer may include the mapping circuitry 944 shown in FIG. 9. In still another aspect, the aforementioned means for selecting coded bits from the circular buffer may include the bit selection circuitry 946 shown in FIG. 9. In still another aspect, the aforementioned means for transmitting the redundancy version may include the transceiver 910 and the processor(s) 904 shown in FIG. 9. In still another aspect, the aforementioned means may be a circuit or any apparatus configured to perform the functions recited by the aforementioned means.

Several aspects of a wireless communication network have been presented with reference to an exemplary implementation. As those skilled in the art will readily appreciate, various aspects described throughout this disclosure may be extended to other telecommunication systems, network architectures and communication standards.

By way of example, various aspects may be implemented within other systems defined by 3GPP, such as Long-Term Evolution (LTE), the Evolved Packet System (EPS), the Universal Mobile Telecommunication System (UMTS), and/or the Global System for Mobile (GSM). Various aspects may also be extended to systems defined by the 3rd Generation Partnership Project 2 (3GPP2), such as CDMA2000 and/or Evolution-Data Optimized (EV-DO). Other examples may be implemented within systems employing IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-10 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1, 2, 7 and/or 9 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of low density parity check (LDPC) coding at a transmitting wireless communication device, the method comprising:

configuring a systematic bit section and a parity bit section of a circular buffer based on a selected mother code rate selected from at least two mother code rates, wherein the at least two mother code rates comprise a reduced mother code rate that is less than a minimum mother code rate at which a maximum information block size produces a maximum codeword size of a decoder at a receiving wireless communication device, wherein the circular buffer comprises a fixed length;

encoding an information block utilizing LDPC coding to produce a codeword comprising systematic bits and parity bits;

inserting the systematic bits into the systematic bit section and the parity bits into the parity bit section;

selecting coded bits for inclusion in a redundancy version of the codeword from the systematic bits in the systematic bit section and the parity bits in the parity bit section; and transmitting a 3rd Generation Partnership Project (3GPP) signal comprising the redundancy version of the codeword over a wireless air interface.

2. The method of claim 1, wherein configuring the systematic bit section and the parity bit section of the circular buffer further comprises:

defining respective sizes of the systematic bit section and the parity bit section of the circular buffer based on the selected mother code rate.

3. The method of claim 2, wherein defining the circular buffer further comprises:

defining the respective sizes of the systematic bit section and the parity bit section of the circular buffer based on an information block size of the information block.

4. The method of claim 3, wherein defining the circular buffer further comprises:

setting the fixed length of the circular buffer equal to a maximum length corresponding to a maximum codeword length.

5. The method of claim 3, wherein defining the circular buffer further comprises:

selecting the information block size of the information block based on an absolute minimum code rate for the codeword.

6. The method of claim 3, wherein encoding the information block utilizing LDPC coding further comprising:

selecting a selected base graph from at least two base graphs for LDPC coding based on the information block size.

7. The method of claim 6, wherein each of the at least two base graphs is associated with a respective one of the at least two mother code rates.

8. The method of claim 1, wherein the redundancy version comprises an initial redundancy version or a subsequent redundancy version.

9. The method of claim 8, wherein each of the initial redundancy version and the subsequent redundancy version comprise different sets of the coded bits.

10. An apparatus comprising a transmitting wireless communication device configured for low density parity check (LDPC) coding, comprising:

a transceiver;
a memory; and
a processor communicatively coupled to the transceiver and the memory, the processor configured to:
configure a systematic bit section and a parity bit section of a circular buffer within the memory based on a selected mother code rate selected from at least two mother code rates, wherein the at least two mother code rates comprise a reduced mother code rate that is less than a minimum mother code rate at which a maximum information block size produces a maximum codeword size of a decoder at a receiving wireless communication device, wherein the circular buffer comprises a fixed length;
encode an information block utilizing LDPC coding to produce a codeword comprising systematic bits and parity bits;
insert the systematic bits into the systematic bit section and the parity bits into the parity bit section;
select coded bits for inclusion in a redundancy version of the codeword from the systematic bits in the systematic bit section and the parity bits in the parity bit section; and
transmit a 3rd Generation Partnership Project (3GPP) signal comprising the redundancy version of the codeword over a wireless air interface via the transceiver.

11. The apparatus of claim 10, wherein the processor is further configured to:

define respective sizes of the systematic bit section and the parity bit section based on the selected mother code rate.

12. The apparatus of claim 11, wherein the processor is further configured to:

define the respective sizes of the systematic bit section and the parity bit section of the circular buffer based on an information block size of the information block.

13. The apparatus of claim 12, wherein the processor is further configured to:

setting the fixed length of the circular buffer equal to a maximum length corresponding to a maximum codeword length.

14. The apparatus of claim 12, wherein the processor is further configured to:

select the information block size of the information block based on an absolute minimum code rate for the codeword.

15. The apparatus of claim 12, wherein the processor is further configured to:

select a selected base graph from at least two base graphs for LDPC coding based on the information block size.

16. The apparatus of claim 15, wherein each of the at least two base graphs is associated with a respective one of the at least two mother code rates.

17. The apparatus of claim 10, wherein the redundancy version comprises an initial redundancy version or a subsequent redundancy version.

18. The apparatus of claim 17, wherein each of the initial redundancy version and the subsequent redundancy version comprise different sets of the coded bits.

19. A transmitting wireless communication device, comprising:

means for configuring a systematic bit section and a parity bit section of a circular buffer based on a selected mother code rate selected from at least two mother code rates, wherein the at least two mother code rates comprise a reduced mother code rate that is less than a minimum mother code rate at which a maximum information block size produces a maximum codeword size of a decoder at a receiving wireless communication device, wherein the circular buffer comprises a fixed length;
means for encoding an information block utilizing LDPC coding to produce a codeword comprising systematic bits and parity bits;
means for inserting the systematic bits into the systematic bit section and the parity bits into the parity bit section;
means for selecting coded bits for inclusion in a redundancy version of the codeword from the systematic bits in the systematic bit section and the parity bits in the parity bit section; and
means for transmitting a 3rd Generation Partnership Project (3GPP) signal comprising the redundancy version of the codeword over a wireless air interface.

20. The wireless communication device of claim 19, wherein the means for configuring the systematic bit section and the parity bit section of the circular buffer further comprises:
means for defining respective sizes of the systematic bit section and the parity bit section of the circular buffer based on the selected mother code rate.

21. The wireless communication device of claim 20, wherein the means for defining the circular buffer further comprises:
means for defining the respective sizes of the systematic bit section and the parity bit section of the circular buffer based on an information block size of the information block.

22. The wireless communication device of claim 21, wherein the means for defining the circular buffer further comprises:
means for setting the fixed length of the circular buffer equal to a maximum length corresponding to a maximum codeword length.

23. The wireless communication device of claim 21, wherein the means for defining the circular buffer further comprises:
means for selecting the information block size of the information block based on an absolute minimum code rate for the codeword.

24. The wireless communication device of claim 21, wherein the means for encoding the information block utilizing LDPC coding further comprising:
means for selecting a selected base graph from at least two base graphs for LDPC coding based on the information block size.

25. The wireless communication device of claim 24, wherein each of the at least two base graphs is associated with a respective one of the at least two mother code rates.

26. The wireless communication device of claim 19, wherein the redundancy version comprises an initial redundancy version or a subsequent redundancy version.

27. The wireless communication device of claim 26, wherein each of the initial redundancy version and the subsequent redundancy version comprise different sets of the coded bits.

28. A non-transitory computer-readable medium storing computer executable code, comprising code that when executed causes a processor within a transmitting wireless communication device to perform the steps of:
configuring a systematic bit section and a parity bit section of a circular buffer based on a selected mother code rate selected from at least two mother code rates, wherein the at least two mother code rates comprise a reduced mother code rate that is less than a minimum mother code rate at which a maximum information block size produces a maximum codeword size of a decoder at a receiving wireless communication device, wherein the circular buffer comprises a fixed length;
encoding an information block utilizing LDPC coding to produce a codeword comprising systematic bits and parity bits;
inserting the systematic bits into the systematic bit section and the parity bits into the parity bit section;
selecting coded bits for inclusion in a redundancy version of the codeword from the systematic bits in the systematic bit section and the parity bits in the parity bit section; and
transmitting a 3rd Generation Partnership Project (3GPP) signal comprising the redundancy version of the codeword over a wireless air interface.

29. The non-transitory computer-readable medium of claim 28, further comprising code that when executed causes a processor to perform the step of:
defining respective sizes of the systematic bit section and the parity bit section based on the selected mother code rate.

30. The non-transitory computer-readable medium of claim 29, further comprising code that when executed causes a processor to perform the step of:
defining the respective sizes of the systematic bit section and the parity bit section of the circular buffer based on an information block size of the information block.

* * * * *